(12) United States Patent
Koyama

(10) Patent No.: US 9,368,053 B2
(45) Date of Patent: Jun. 14, 2016

(54) DISPLAY DEVICE

(75) Inventor: Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 278 days.

(21) Appl. No.: 13/228,494

(22) Filed: Sep. 9, 2011

(65) Prior Publication Data

US 2012/0062529 A1 Mar. 15, 2012

(30) Foreign Application Priority Data

Sep. 15, 2010 (JP) .................................. 2010-206206
May 13, 2011 (JP) .................................. 2011-108150

(51) Int. Cl.
*G09G 3/20* (2006.01)
*H01L 27/12* (2006.01)
(Continued)

(52) U.S. Cl.
CPC .............. *G09G 3/20* (2013.01); *H01L 27/1225* (2013.01); *G09G 3/3275* (2013.01);
(Continued)

(58) Field of Classification Search
CPC ..................... G09G 2300/0842; G09G 3/3648; G09G 3/3688; G09G 2310/0281; G09G 2310/0297; G09G 2320/0233; G09G 2320/0686; G09G 2300/0809; G09G 2300/0819; G09G 2300/0823; G09G 2300/0861; G09G 2310/0248; G09G 2310/0256; G09G 2320/043; G09G 3/3685; G09G 3/3696; G06F 12/0864; G06F 12/0895; G06F 1/3234; G06F 2203/04103; G06F 2212/1028; G06F 3/0421
USPC ........................ 315/169.1; 345/98–99; 257/43
See application file for complete search history.

(56) References Cited

U.S. PATENT DOCUMENTS 5,250,931 A 10/1993 Misawa et al.
5,570,105 A 10/1996 Koyama
(Continued)

FOREIGN PATENT DOCUMENTS

EP 0461928 A 12/1991
EP 1737044 A 12/2006
(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Sanjiv D Patel
(74) *Attorney, Agent, or Firm* — Eric J. Robinson; Robinson Intellectual Property Law Office, P.C.

(57) ABSTRACT

Provided is to secure a data-writing period to a source line and reduce the number of the IC chips used. N image data (e.g., three image data, RGB) are sequentially input to one input terminal. Three switches, three first memory elements, three transfer switches, three second memory elements, and three buffers are connected in parallel to the input terminal. The three switches are turned on respectively. RGB image data are held in the three respective first memory elements. In a selection period of a gate line of an (m−1)-th row, image data of an m-th row are written to the first memory elements. When the three transfer switches are turned on in a selection period of a gate line of an m-th row, the image data are transferred to and held in the second memory elements. Then, the image data are output to each source line through each buffer.

9 Claims, 31 Drawing Sheets

(51) Int. Cl.
*G09G 3/32* (2016.01)
*G09G 3/36* (2006.01)

(52) U.S. Cl.
CPC ..... *G09G 3/3688* (2013.01); *G09G 2310/0275* (2013.01); *G09G 2310/0294* (2013.01); *G09G 2310/0297* (2013.01); *G09G 2310/08* (2013.01)

(56) References Cited

U.S. PATENT DOCUMENTS

| | | | |
|---|---|---|---|
| 5,602,561 | A | 2/1997 | Kawaguchi et al. |
| 5,731,856 | A | 3/1998 | Kim et al. |
| 5,744,864 | A | 4/1998 | Cillessen et al. |
| 5,748,165 | A | 5/1998 | Kubota et al. |
| 6,049,321 | A | 4/2000 | Sasaki |
| 6,268,841 | B1 * | 7/2001 | Cairns et al. ............... 345/98 |
| 6,294,274 | B1 | 9/2001 | Kawazoe et al. |
| 6,392,631 | B1 * | 5/2002 | Bertin et al. ............... 345/103 |
| 6,424,328 | B1 | 7/2002 | Ino et al. |
| 6,476,789 | B1 | 11/2002 | Sakaguchi et al. |
| 6,486,497 | B2 | 11/2002 | Misawa et al. |
| 6,563,174 | B2 | 5/2003 | Kawasaki et al. |
| 6,606,080 | B2 | 8/2003 | Mukao |
| 6,727,522 | B1 | 4/2004 | Kawasaki et al. |
| 6,774,574 | B1 | 8/2004 | Koyama |
| 6,777,885 | B2 | 8/2004 | Koyama |
| 6,784,865 | B2 | 8/2004 | Akimoto et al. |
| 6,909,411 | B1 | 6/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |
| 7,158,128 | B2 | 1/2007 | Fujino et al. |
| 7,205,610 | B2 | 4/2007 | Koyama |
| 7,211,825 | B2 | 5/2007 | Shih et al |
| 7,259,742 | B2 | 8/2007 | Chang et al. |
| 7,268,756 | B2 | 9/2007 | Koyama et al. |
| 7,282,782 | B2 | 10/2007 | Hoffman et al. |
| 7,297,977 | B2 | 11/2007 | Hoffman et al. |
| 7,312,473 | B2 | 12/2007 | Koyama et al. |
| 7,323,356 | B2 | 1/2008 | Hosono et al. |
| 7,372,437 | B2 | 5/2008 | Koyama |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,674,650 | B2 | 3/2010 | Akimoto et al. |
| 7,728,653 | B2 | 6/2010 | Kimura et al. |
| 7,732,819 | B2 | 6/2010 | Akimoto et al. |
| 7,742,044 | B2 | 6/2010 | Yu et al. |
| 7,746,331 | B2 | 6/2010 | Tai et al. |
| 8,004,513 | B2 | 8/2011 | Kimura et al. |
| 8,134,156 | B2 | 3/2012 | Akimoto |
| 8,139,052 | B2 * | 3/2012 | Ito .................... 345/204 |
| 8,158,464 | B2 | 4/2012 | Akimoto |
| 8,304,765 | B2 | 11/2012 | Yamazaki et al. |
| 8,368,079 | B2 | 2/2013 | Akimoto |
| 8,525,165 | B2 | 9/2013 | Akimoto |
| 2001/0046027 | A1 | 11/2001 | Tai et al. |
| 2002/0056838 | A1 | 5/2002 | Ogawa |
| 2002/0063674 | A1 | 5/2002 | Chiang |
| 2002/0089485 | A1 | 7/2002 | Youn |
| 2002/0132454 | A1 | 9/2002 | Ohtsu et al. |
| 2003/0006979 | A1 | 1/2003 | Tsuchi et al. |
| 2003/0085865 | A1 | 5/2003 | Lee et al. |
| 2003/0189401 | A1 | 10/2003 | Kido et al. |
| 2003/0218222 | A1 | 11/2003 | Wager et al. |
| 2004/0036116 | A1 * | 2/2004 | Tran .................... 257/345 |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0093809 | A1 * | 5/2005 | Lim .................... 345/100 |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0232540 | A1 * | 10/2006 | Miyaoka .................... 345/98 |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0090365 | A1 | 4/2007 | Hayashi et al. |
| 2007/0091050 | A1 * | 4/2007 | Katayama et al. ............... 345/98 |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0068316 | A1 * | 3/2008 | Maekawa .................... 345/87 |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0231584 | A1 * | 9/2008 | Hirakata .................... 345/98 |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0085073 | A1 * | 4/2009 | Droopad et al. ............... 257/288 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0186445 | A1 | 7/2009 | Akimoto |
| 2009/0189155 | A1 | 7/2009 | Akimoto |
| 2009/0224245 | A1 * | 9/2009 | Umezaki .................... 257/59 |
| 2009/0251455 | A1 * | 10/2009 | Park et al. .................... 345/214 |
| 2009/0278122 | A1 | 11/2009 | Hosono et al. |
| 2009/0280600 | A1 | 11/2009 | Hosono et al. |
| 2010/0003783 | A1 | 1/2010 | Akimoto |
| 2010/0065844 | A1 | 3/2010 | Tokunaga |
| 2010/0072467 | A1 | 3/2010 | Yamazaki et al. |
| 2010/0092800 | A1 | 4/2010 | Itagaki et al. |
| 2010/0109002 | A1 | 5/2010 | Itagaki et al. |

(56) References Cited

U.S. PATENT DOCUMENTS

| | | | |
|---|---|---|---|
| 2011/0001749 | A1* | 1/2011 | Min et al. .................. 345/214 |
| 2011/0133183 | A1 | 6/2011 | Yamazaki et al. |

FOREIGN PATENT DOCUMENTS

| | | |
|---|---|---|
| EP | 2226847 A | 9/2010 |
| EP | 2421030 A | 2/2012 |
| JP | 60-198861 A | 10/1985 |
| JP | 62-143095 | 6/1987 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-289917 | 11/1989 |
| JP | 02-306583 A | 12/1990 |
| JP | 04-050895 A | 2/1992 |
| JP | 05-011724 A | 1/1993 |
| JP | 05-061435 A | 3/1993 |
| JP | 05-251705 A | 9/1993 |
| JP | 07-191641 A | 7/1995 |
| JP | 07-306663 A | 11/1995 |
| JP | 08-137443 A | 5/1996 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-005426 | 1/2001 |
| JP | 2001-242839 | 9/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-228333 | 8/2003 |
| JP | 2003-255880 | 9/2003 |
| JP | 2004-103957 A | 4/2004 |
| JP | 2004-273614 A | 9/2004 |
| JP | 2004-273732 A | 9/2004 |
| JP | 2005-116977 A | 4/2005 |
| JP | 2006-293135 | 10/2006 |
| JP | 2008-112143 A | 5/2008 |
| JP | 2010-098305 A | 4/2010 |
| TW | 200620231 | 6/2006 |
| TW | 200952090 | 12/2009 |
| TW | 201021211 | 6/2010 |
| WO | WO-2004/114391 | 12/2004 |
| WO | 2007/058329 | 5/2007 |
| WO | 2010/032629 | 3/2010 |
| WO | WO-2010/032640 | 3/2010 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", NATURE, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO) 5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer)Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

(56) References Cited

OTHER PUBLICATIONS

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09, SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID; 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3—A2O3—BO Systems [A; Fe, Ga, or Al; B: Mg, Mn, Fe, Ni, Cu, or Zn]at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on $SrTiO_3$ With Sputtered $Al_2O_3$ Gate Insulator,", Appl. Phys. Lett. (Applied Physics Letters), Sep. 1, 2003, vol. 83, No. 9, pp. 1755-1757.

Taiwanese Office Action (Application No. 100132438) Dated Jan. 14, 2016.

* cited by examiner

FIG. 17A            FIG. 17B
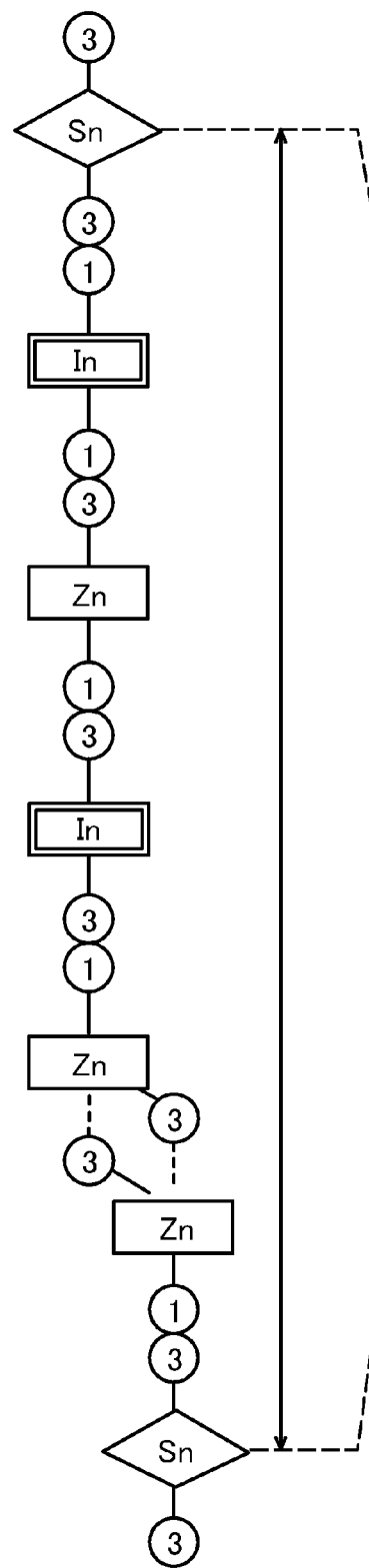
FIG. 17C
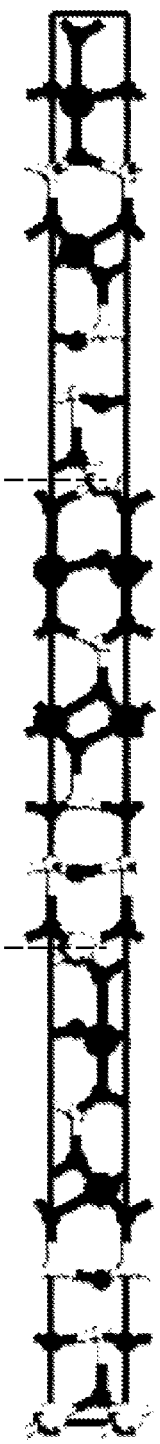
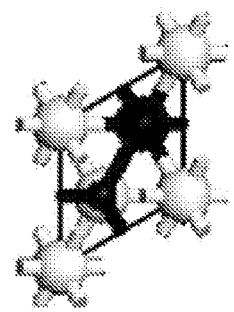
● In
◐ Sn
◡ Zn
• O FIG. 18A     FIG. 18B
FIG. 18C
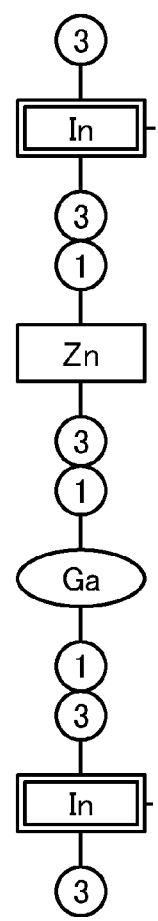
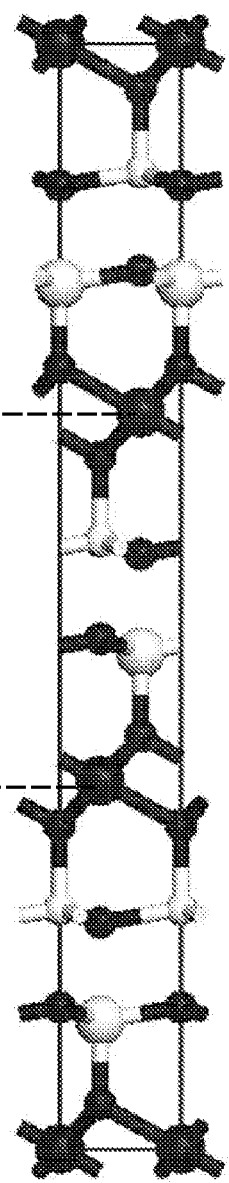
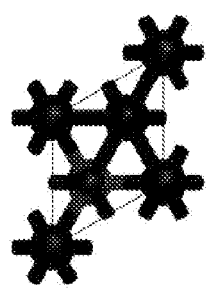
● In
○ Ga
○ Zn
● O

DISPLAY DEVICE

BACKGROUND OF THE INVENTION

1. Field of the Invention

The present invention relates to a display device such as a liquid crystal display device and an EL display device.

2. Description of the Related Art

There are two methods to provide a driver circuit which drives a source line and a gate line in a display device such as a liquid crystal display device and an EL display device. One is a method by which a pixel and a driver circuit are integrated over one substrate. The other is a method by which part of or all of the function of a driver circuit is integrated into an IC chip, and the IC chip is mounted over a substrate including a pixel by a chip on glass (COG) or a chip on film (COF). A display device with a medium or larger size (10 inches or larger) is mostly mounted with a driver IC chip. This is because an amorphous silicon transistor, of which the mobility is not high enough to be employed to a driver circuit, is used for a pixel in a middle-sized display device and a large-sized display device.

The number of pins of a driver IC chip is generally 300 to 500; therefore, the number of driver IC chips depends on a resolution of the display device. When the resolution of a color display device is QVGA (320×240), the number of source lines is 320×3 (RGB)=960 and the number of gate lines is 240, so that 1 gate driver IC chip and 3 source driver IC chips are used.

FIG. 11 is a block diagram showing an example of a structure of a conventional display device (with RGB color display, resolution QVGA) in which a source driver IC chip is used. As shown in FIG. 11 and a display device 600 includes a pixel region 610 and a gate driver circuit 620. As an example, the gate driver circuit 620 is incorporated in the display device 600 and not externally provided: the gate driver circuit 620 is integrated with the pixel region 610 over a substrate 601. A source driver circuit is formed using three external components: source driver IC chips 631 to 633.

In order to reduce the number of driver IC chips without lowering resolution, the number of input terminals connected to the pin of driver IC chip needs to be reduced. For example, the number of input terminals can be reduced by providing a switch in each source line over the same substrate as the pixel region. A structural example of a display device with such a structure is shown in FIG. 13.

In a display device 650 of FIG. 13, color display is performed by an RGB method and the resolution is QVGA as in the display device 600. The display device 650 includes a source driver IC chip 651, which is externally provided, as a source driver circuit and an analog switch array 652 incorporated in the substrate 601. The analog switch array 652 includes the same number of switch circuits 660 as the number of pins to which an image data of the source driver IC chip 651 is output. When the resolution is QVGA, 320 switch circuits 660 are provided in the analog switch array 652. An example of a structure of the switch circuit 660 is shown in FIG. 14.

The switch circuit 660 includes an input terminal 661 connected to an output of the source driver IC chip 651 and 3 transistors 671 to 673 connected to the input terminal 661. Output terminals 681 to 683 in the transistors 671 to 673 are connected to different source lines. The transistors 671 to 673 function as switching elements and on/off thereof is controlled by a selection signal (SLC-R, SLC-G, and SLC-B) input from a gate. By employing the display device 650 of FIG. 13 to an EL display device, time division driving (time gray scale display) can be performed (for time division driving, see Patent Document 1, for example).

However, in the display device 650 of FIG. 13, the number of source driver IC chips 651 is 1; therefore, a period to write an image data to a source line is shortened compared to the display device 600 of FIG. 11. This will be described with reference to FIG. 12 and FIG. 15. FIG. 12 is a flow chart showing a driving method of the display device 600. FIG. 15 is a flow chart showing a driving method of the display device 650.

In FIG. 12 and FIG. 15, "G1 to G240" denote 240 gate lines. "S1R, S1G, S1B, S2R, . . . S320B" denote 320×3 source lines. "S2R" indicates a second source line to which a red image data is input.

As shown in FIG. 12, the gate lines G1, G2, G3, . . . G240 of the display device 600 are sequentially selected. In a gate line selection period, image data corresponding to a selected row is input to each source lines S1R, S1G, S1B, S2R, . . . S320B. In FIG. 12, an input signal to the source lines S1R, S1G, S1B, S2R, . . . S320B in a period during which an n-th gate line Gn is selected is shown as an example.

Next, a driving method of the display device 650 is described with reference to FIG. 15. In the display device 650, the gate lines G1, G2, G3, . . . G240 are sequentially selected. However, in the display device 650, 3 image data of RGB are output from 1 terminal of the source driver IC chip 651.

In a selection period of the gate line Gn, a selection signal SLC-R is input, whereby the transistor 671 of the switch circuit 660 of FIG. 14 is turned on, and red (R) image data which is output from the source driver IC chip 651 is output to the source lines (S1R, S2R, . . . S320R). Then, the selection signal SLC-R becomes low and the selection signal SLC-G becomes high, whereby the transistors 671 and 673 are turned off and the transistor 672 is turned on; thus, green (G) image data is output to the source lines (S1G, S2G, . . . S320G). Then, the selection signal SLC-G is low, the selection signal SLC-B is high, whereby blue (B) image data is output to the source lines (S1B, S2B, . . . S320B). In such a manner, in the display device 650, 3 image data output from 1 output terminal of the driver IC chip 651 are input to 3 source lines.

REFERENCE

[Patent Document 1] Japanese Published Patent Application No. 2001-005426

SUMMARY OF THE INVENTION

As described above, in the display device 650 of FIG. 13, the number of IC chips externally provided can be reduced by providing an analog switch array in the source driver circuit, which is advantageous; however, a problem in that a period to write an image data to a source line is shortened occurs. For example, in the display device 650, as shown in FIG. 15, when a period to write an R image data is considered to be 1, a period to write a G image data is shortened to ⅔ of that of an R image data and a period to write a B image data is shortened to ⅓ of that of an R image data. When the driving rate is a normal frame rate (displaying 60 frames per second), the driving method in FIG. 15 does not have a big influence on the display quality.

Recently, in order to improve the display quality of the display device, the driving rate has been doubled or more (also referred to as a double-frame rate driving). In order to realize a display device with three-dimensional display (3D), an image for a right eye and an image for a left eye need to be displayed alternately; thus, the display device is required to be driven at the double frame rate or the four-time frame rate.

For this reason, in the case where the double-frame rate driving is performed by the driving method of FIG. 15 in which a plurality of image data is output from 1 terminal of an IC chip, a problem in that a period of writing to the source line is insufficient becomes obvious. For example, when the four-time-frame rate driving is performed by the driving method of FIG. 15, a period of writing image data of B to the source line is one-twelfth (=4×3) of a writing period in the normal frame rate driving. When the length of writing periods with respect to the response rate of a pixel becomes insufficient, the pixel is unable to respond, whereby the display device is unable to function.

Therefore, in order to drive the display device by the double-frame rate driving to realize 3D display, high-quality display, and the like and ensure a period of writing image data to the source line, such a structure needs to be employed in which 1 kind of image data is output from 1 output terminal of the source driver IC chip as the display device 600 in FIG. 11. Thus, it is very difficult to achieve both the double-frame rate driving and reducing the number of external IC chips used.

In view of the above, an object of the present invention is to provide a display device in which both the double-frame rate driving and reducing the number of external IC chips used are easily achieved.

One embodiment of the present invention is a display device including a first functional circuit including an input terminal to which a signal including n (n is an integer greater than or equal to 3) image data is input and dividing the signal inputted to the input terminal into n image data; a second functional circuit including n first memory elements to which n image data divided in the first functional circuit is input and n second memory elements and transferring the image data held in the n first memory elements to the n second memory elements at the same timing; and a third functional circuit outputting the image data held in the n second memory elements to n source lines different from each other.

In the above embodiment, the first to third functional circuits can be formed over the same substrate as a pixel region of the display device. In addition, as a transistor in the pixel region and the first to third functional circuits, a transistor in which a channel formation region is formed using an oxide semiconductor layer can be used. Further, a fourth functional circuit outputting n image data to the first functional circuit can be formed with the use of an IC chip.

Another embodiment of the present invention is a display device including an input terminal, n switches connected to the input terminal in parallel, n first memory elements connected to the n switches different from each other, n transfer switches connected to output terminals of the n first memory elements different from each other, n second memory element connected to output terminals of the n transfer switches different from each other, n buffers connected to output terminals of the n second memory elements different from each other, and n source lines connected to output terminals of the n buffers different from each other.

Another embodiment of the present invention is a display device including a buffer connected to an input terminal of a source line, a second memory element connected to an input terminal of the buffer, a first memory element connected to an input terminal of the second memory element through a transfer switch, a switch connected to an input terminal of the first memory element, and an input terminal in which n (n is an integer greater than or equal to 3) switch is connected in parallel.

In the above two embodiments, on/off of the n switches connected to one input terminal are controlled by different signals each other and on/off of n transfer switches are controlled by one signal.

In addition, in the display device according to any of the embodiments, the switch, the first and second memory elements, the transfer switch, and the buffer can be formed over the substrate over which the source line is formed. When transistors are used for the switch, the transfer switch, and the buffer, channel formation regions of these transistors are preferably formed using an oxide semiconductor.

Here, some points to be noted on a description of a source and a drain of a transistor in this specification will be described. A transistor includes 3 terminals: a gate, a source, and a drain. In a circuit including a transistor, a "source" and a "drain" of the transistor can be switched depending on the polarity of the transistor, a direction of current, a level of the potential. Therefore, in this specification, a description of the transistor can be read with the terms "source" and "drain" switched. In this specification, among the 3 terminals of the transistor, 2 terminals serving as a source and a drain are referred to as a first terminal and a second terminal. That is, one of the first terminal and the second terminal of the transistor serves as a source and the other serves as a drain.

Even when a plurality of image data is input from 1 input terminal, a period of writing the plurality of image data to the source line can be uniform regardless of the order in which the image data is input from the input terminal. That is because the display device has a function of dividing the plurality of image data, a first memory element, a second memory element, and a function of transferring the data from the first memory element to the second memory element. Accordingly, the period of writing data to the source line is easily ensured, and it becomes easier to achieve both the double-frame rate driving and reducing the number of external IC chips used.

BRIEF DESCRIPTION OF THE DRAWINGS

FIGS. 17A to 17C are diagrams showing a crystal structure of an oxide semiconductor.

FIGS. 18A to 18C are diagrams showing a crystal structure of an oxide semiconductor.

DETAILED DESCRIPTION OF THE INVENTION

Embodiment 1

A display device of this embodiment will be described with reference to FIG. 1 to FIG. 6.

Figure 1:
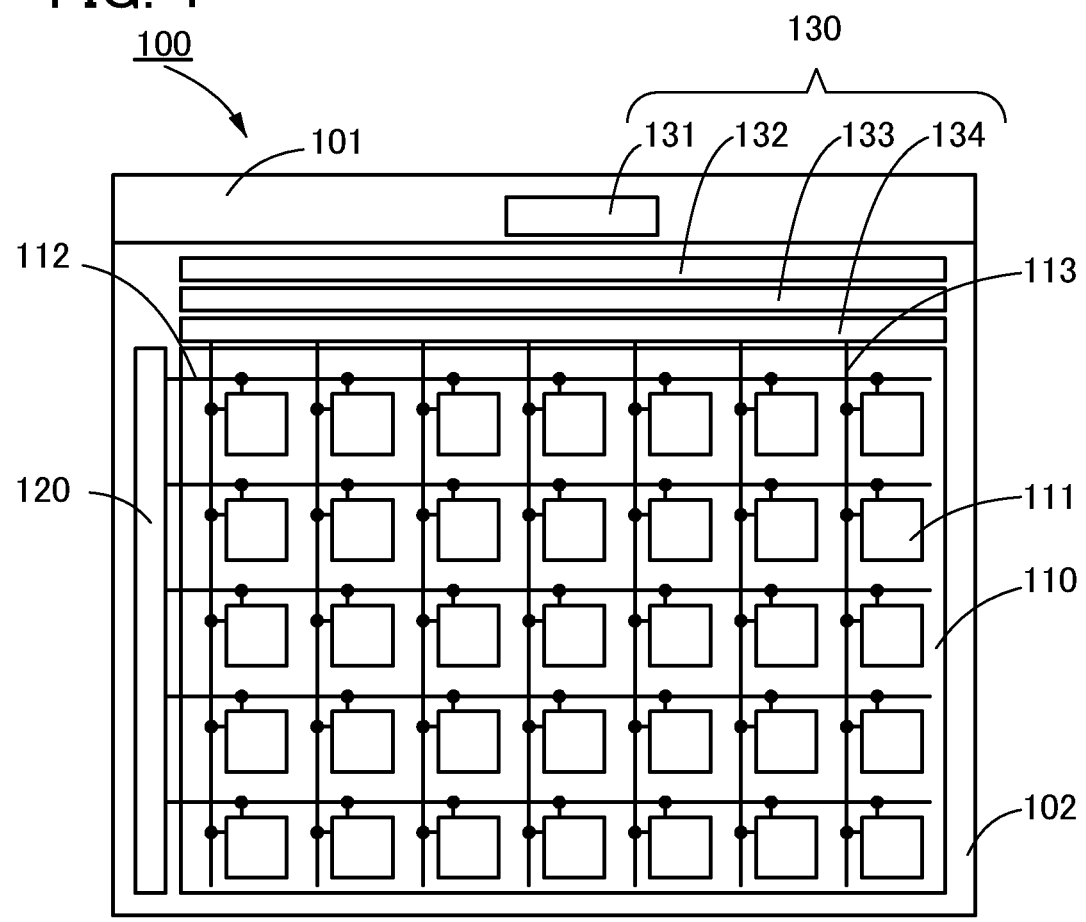
FIG. 1 is a block diagram showing an example of a structure of a display device.

FIG. 1 is a block diagram showing an example of a structure of the display device of this embodiment. A display device 100 shown in FIG. 1 includes a pixel region 110 where an image is displayed, a gate driver circuit 120, and a source driver circuit 130. In the pixel region 110, a plurality of pixels 111, a plurality of gate lines 112, and a plurality of source lines 113 are formed. The source driver circuit 130 includes a source driver IC chip 131, an analog switch array 132, an analog memory array 133, and an analog buffer circuit 134.

The display device 100 has two substrates: a substrate 101 and a substrate 102. The substrate 101 is provided with transistors in the pixel region 110, the gate driver circuit 120, the analog switch array 132, the analog memory array 133, and the analog buffer circuit 134.

The substrate 102 is provided to face the substrate 101. The source driver IC chip 131 is provided by COG in a region of the substrate 101, the region does not overlap with the substrate 102. The source driver IC chip 131 may be provided by a method other than COG. The circuitry included in the source driver circuit 130 other than the source driver IC chip 131 can be formed over the substrate 101 where the pixel region 110 is formed. That is, in a manufacturing step of the pixel region 110 over the substrate 101, the analog switch array 132, the analog memory array 133, and the analog buffer circuit 134 can be formed over the substrate 101.

In addition, the gate driver circuit 120 can be formed with an IC chip mounted on the substrate 101.

Figure 2:
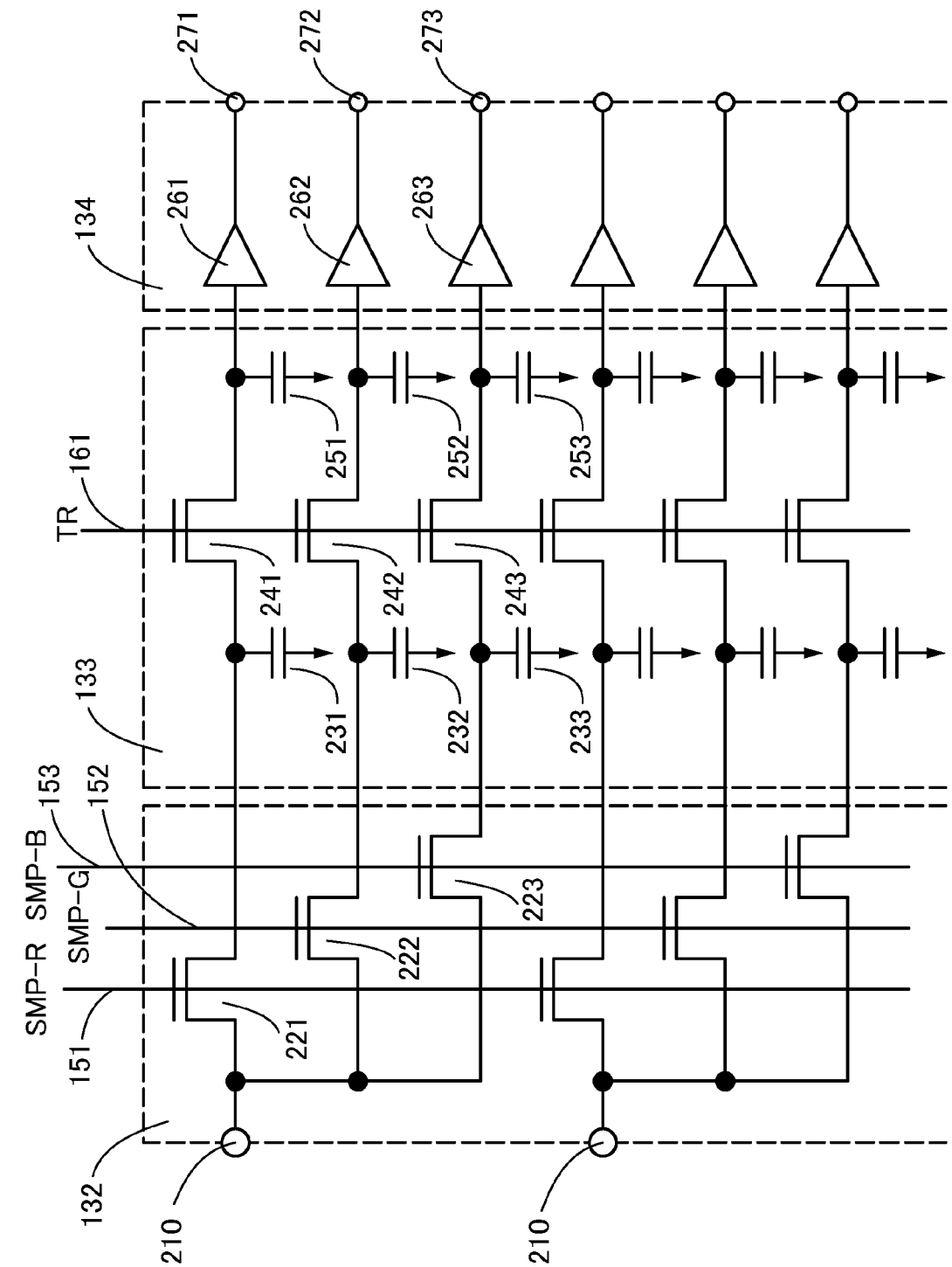
FIG. 2 is a circuit diagram showing an example of a structure of a source driver circuit.

FIG. 2 is a circuit diagram showing an example of a structure of the analog switch array 132, the analog memory array 133, and the analog buffer circuit 134.

The analog switch array 132 includes an input terminal 210 per output terminal of the source driver IC chip 131. FIG. 2 shows two input terminals 210. In the analog switch array 132, 3 transistors 221, 222, and 223 are connected to each input terminal 210. These transistors 221 to 223 serve as switches.

In the analog switch array 132, the number of analog switches connected to each input terminal 210 depends on the number of image data inputted from the input terminal 210. Alternatively or in addition, the number of switches connected to each input terminal 210 is decided in accordance with the number of source lines to which image data outputted from one output terminal of the source driver IC chip 131 is inputted finally.

In this embodiment, an example will be described in which a color image is displayed with image data of three primary colors RGB in the display device 100 and image data of three kinds of RGB are output from one output terminal of the source driver IC chip 131. Therefore, as shown in FIG. 2, in the analog switch array 132, 3 analog switches (the transistors 221 to 223) are connected to each input terminal 210 in parallel.

As a method for color display, for example, in the case where a color image is displayed with image signals of four colors such as RGBW (red, green, blue, and white), RGBY (red, green, blue, and yellow), and the like, 4 analog switches (transistors) may be provided for each input terminal 210.

As shown in FIG. 2, gates of the transistors 221, 222, and 223 are connected to sampling signal lines 151, 152, and 153, respectively. Sampling signals SMP-R, SMP-G, and SMP-B for turning on the transistors 221, 222, and 223 at different timing are input to the sampling signal lines 151, 152, and 153, respectively.

In addition, first terminals of the transistors 221, 222, and 223 are commonly connected to the input terminal 210, and second terminals of each of the transistors 221, 222, and 223 are connected to respective first memory elements provided in the analog memory array 133.

In the analog memory array 133, each output of the analog switch array 132 is provided with 2 memory elements (a first memory element and a second memory element) and 1 switch. Therefore, the same number of elements as image data inputted from the input terminal 210 is provided for each input terminal 210. Accordingly, in the analog memory array 133, 3 first memory elements (capacitors 231, 232, and 233), 3 second memory elements (capacitors 251, 252, and 253), and 3 transfer switches (transfer transistors 241, 242, and 243) are provided for to each input terminal 210. In the example of FIG. 2, the first memory element and the second memory element are the capacitors and the transfer switch is the transistor.

As shown in FIG. 2, the transistors 221, 222, and 223 (different analog switches) are connected to first terminals of the transfer transistors 241, 242, and 243, respectively. One terminals of the capacitors 231, 232, and 233 are connected to the first terminals of the transfer transistors 241, 242, and 243, respectively. One terminals of the capacitors 251, 252, and 253 are connected to the second terminals of the transfer transistors 241, 242, and 243, respectively. The other terminal of each of the capacitors 231, 232, 233, 251, 252, and 253 is supplied with a fixed potential such as a ground potential. In addition, a gate of each of the transfer transistors 241, 242, and 243 is connected to a transfer signal line 161 to which a transfer signal TR is inputted.

In the analog buffer circuit 134, 1 buffer is provided for each output of the analog memory array 133. That is, 3 buffers are provided for each input terminal 210.

In FIG. 2, the second terminals of the transfer transistors 241, 242, and 243 are provided with analog buffers 261, 262, and 263, respectively. Respective output terminals 271, 272, and 273 of the analog buffers 261, 262, and 263 are connected to respective three source lines 113 in the pixel region 110. Image data of R, G and B are output from the output terminals 271, 272, and 273, respectively.

Figure 3:
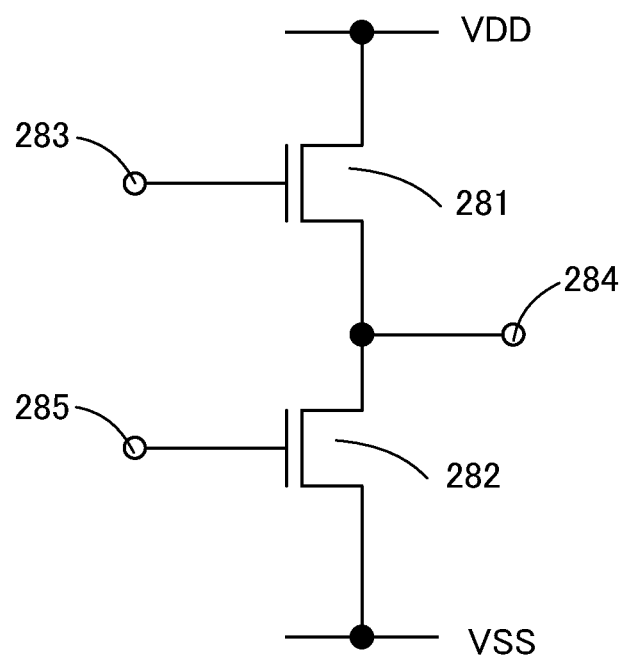
FIG. 3 is a circuit diagram showing an example of a structure of an analog buffer used in the circuit of FIG. 2.

In FIG. 3, an example of a structure of the analog buffer 261, 262 and 263 is shown specifically. A source follower circuit as shown in FIG. 3 is one of examples of the analog buffers 261 to 263. For example, the source follower circuit includes two transistors 281 and 282, an input terminal 283, output terminal 284, and a bias terminal 285. Note that each of the analog buffers 261 to 263 is not limited to the source follower circuit.

Figure 4:
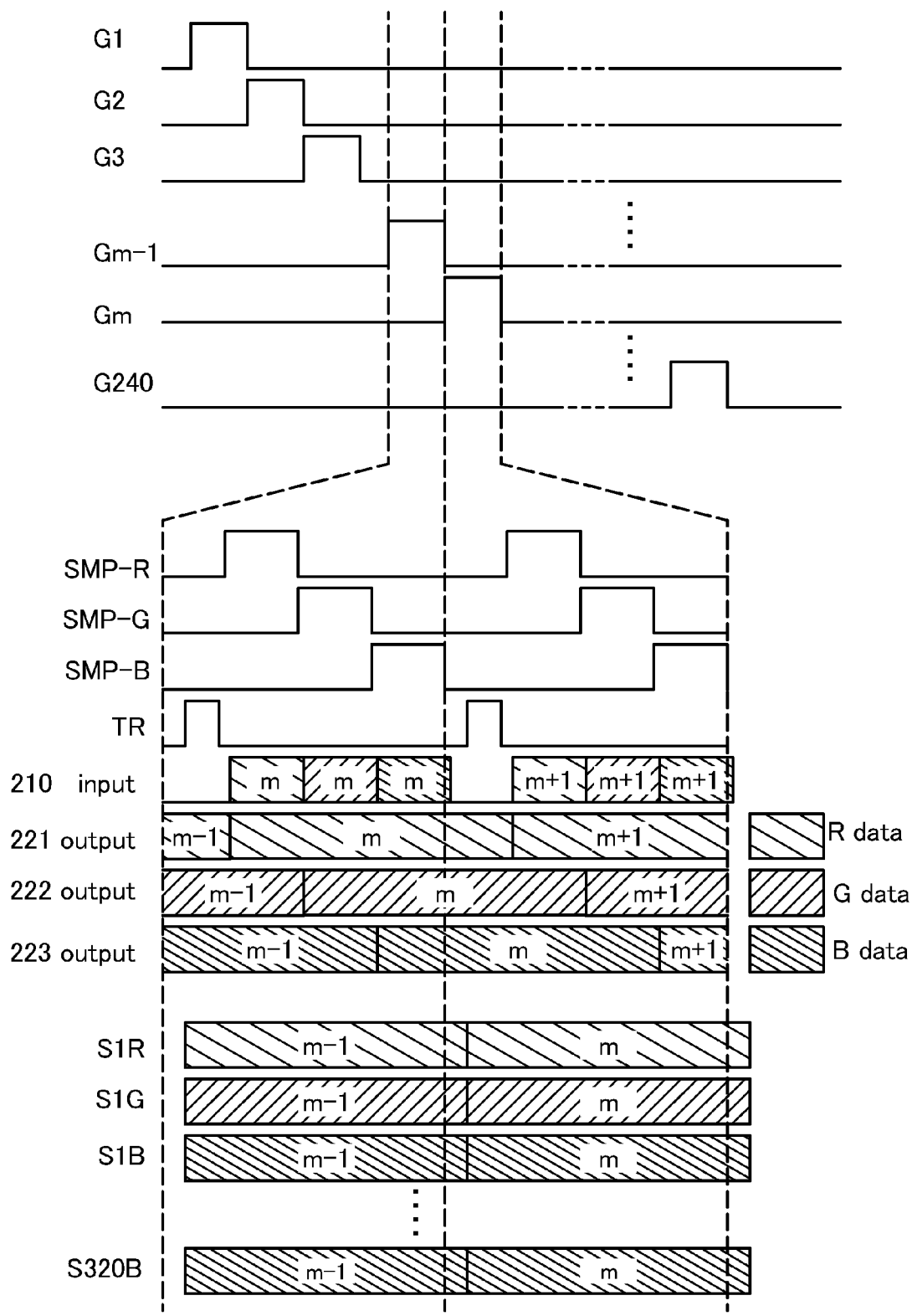
FIG. 4 is a flow chart showing an example of a driving method of the display device.

Next, operations of the analog switch array 132, the analog memory array 133, and the analog buffer circuit 134 will be described with reference to a timing chart of FIG. 4. In FIG. 4, as an example of a timing chart of the circuits (132 to 134) of FIG. 2, a timing chart in the case where the resolution of the pixel region 110 is QVGA is shown. In the pixel region 110, 240 gate lines 112 are provided in the row direction and 960 (320×3 (RGB)) source lines 113 are provided in the column direction.

Here, in order to distinguish the 240 gate lines 112, the first gate line 112 is represented as a "gate line G1." The first source line 113 is, in order to show the position and the color difference of an image signal inputted to the first source line 113, represented as a "source line S1R." The "source line S1R" represents the first source line 113 to which red image data is input (hereinafter, the red image data is referred to as R data. Similarly, green image data and blue image data are referred to as G data and B data, respectively).

In FIG. 4, a timing chart of a selection signal inputted to a gate signal line (G1, G2, . . . G240) and a timing chart of the circuits (132 to 134) of FIG. 2 in selection periods of the gate signal lines Gm−1 and Gm are shown. Further, "m−1" and "m" represents image data inputted to the pixels 111 in the (m−1)-th row and to the pixels 111 in the m-th row, respectively.

In this embodiment, 3 image data is output from 1 output terminal of source driver IC chip 131 as 1 data. Accordingly, the number of output terminals of the source driver IC chips 131 (the number of pins) can be reduced to ⅓ of the number of the source lines 113. That is, the number of the source driver IC chips 131 can be ⅓ of that in the case where each pin of the source driver IC chip is connected per source line 113.

The source driver IC chip 131 outputs three kinds of RGB image data as one signal. The signal is input to the input terminal 210 of the analog switch array 132. As shown in FIG. 4, in the selection period of the gate signal line Gm−1, R data, G data, and B data which are input to the pixels 111 in the m-th row are sequentially input to the input terminal 210. The image data corresponding to the source lines 113 of the m-th row is input to all of the input terminals 210 of the analog switch array 132.

In the same selection period, sampling signals SMP-R, SMP-G, and SMP-B are input to the sampling signal lines 151, 152, and 153, respectively, whereby the transistors 221, 222, and 223 of the analog switch array 132 are sequentially turned on. The data input from the input terminal 210 are sampled to be 3 data: R data, G data, and B data in the m-th row, with the analog switches (the transistors 221 to 223) and is output to the capacitors 231, 232, and 233. Output data of the analog switches (the transistors 221 to 223) are shown in FIG. 4. In the selection period of the gate line Gm−1, image data in the following row (the m-th row) is sampled by the capacitors 231 to 233 in the analog memory array 133.

In the selection period of the gate line Gm, the transfer signal TR is input to the transfer signal line 161, whereby all the transfer transistors 241 to 243 are turned on, so that data in the m-th row held in the capacitors 231, 232, and 233 are transferred to the capacitors 251, 252, and 253 at the same timing and held. The image data in the m-th row held in the capacitors 251, 252, and 253 are written to the source lines 113 connected to the output terminal 271, 272, and 273 through the analog buffers 261, 262, and 263, respectively.

In this manner, in the selection period of the gate line Gm, image data in the m-th row is input to the source lines S1R, S1G, . . . S320B. In addition, in the selection period, image data in an (m+1)-th row is held in the capacitors 231 to 233. Then, in the selection period of the gate line Gm+1, the image data held in the capacitors 231 to 233 are written to the source lines S1R, S1G, . . . S320B. As described above, the gate lines (G1, G2, . . . G240) are sequentially selected, so that one image is displayed in the pixel region 110.

Figure 15:
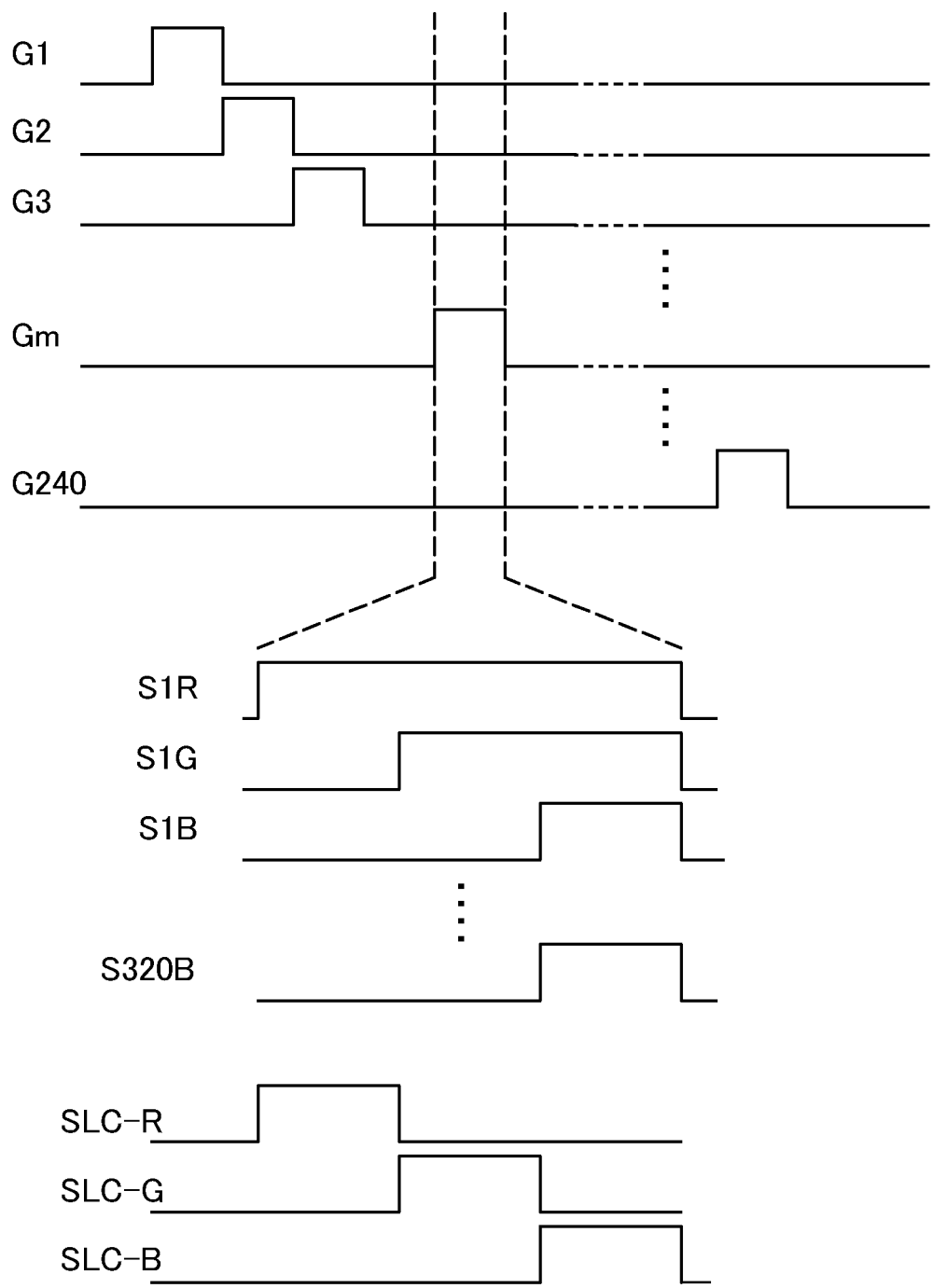
FIG. 15 is a flow chart showing an example of a driving method of the display device in FIG. 13.

In this embodiment, similarly to a driving method of FIG. 15, image data of R, G, and B is input in this order from 1 input terminal 210. However, in this embodiment, 3 image data RGB can be written to the source lines at the same timing, so that respective periods to write R data, G data, and B data to the source line 113 can be equal to each other. In addition, the period can be the same length as the gate line selection period.

As described above, the analog switch array 132 is a functional circuit to divide and sample the data inputted from the input terminal 210 to be n image data (n represents an integer greater than or equal to 3. In the example shown in FIG. 4, n is 3). The on/off of the n switches (the transistors 221 to 223) are controlled by the different signals (the sampling signals SMP-R, SMP-G, and SMP-B), the n image data are input to the analog memory array 133 in parallel and held in the n first memory elements.

The analog memory array 133 is a functional circuit having a function of transferring the image data held in the n first memory elements (the capacitors 231 to 233) to the different n second memory elements (the capacitors 251 to 253) at the same timing, in conjunction with the on/off of the n transfer switches (the transfer transistors 241 to 243).

The n transfer switches (the transfer transistors 241 to 243) are controlled to be on/off by the same signal (the transfer signal TR). The image data held in the n second memory elements are output to the analog buffer circuit 134 in parallel. In the analog buffer circuit 134, the inputted n image data are buffered and then written to the n source lines 113.

As shown in FIG. 4, in this embodiment, the length of the period of writing data to each of the source line 113 can be almost the same as the selection period of the gate line 112. In addition, although the image data of RGB are input to the input terminal 210 at different timing, each period of writing R data, G data, and B data to the source line 113 can be equal to each other. That is, even with less number of output terminals of the source driver IC chip 131 (the number of pins) than the number of source lines 113, a period long enough to write data to the source line 113 can be obtained.

Next, operation of the pixel 111 will be described with reference to the timing chart of FIG. 4. Here, the case where the display device 100 is as applied to an EL display device will be described. An example of the structure of the pixel region 110 in the EL display device is shown in FIG. 5.

Figure 5:
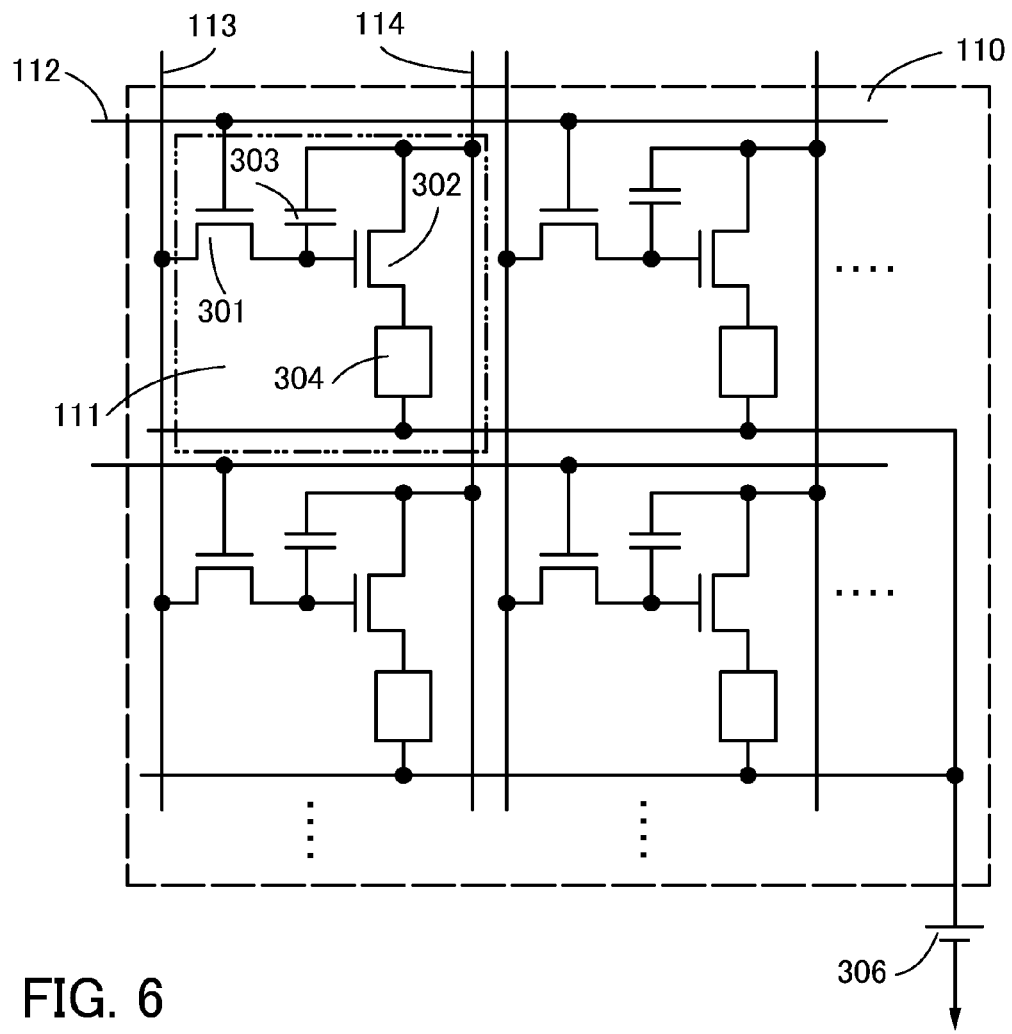
FIG. 5 is a circuit diagram showing an example of a structure of a pixel of an EL display device.

As shown in FIG. 5, the pixel region 110 includes a plurality of pixels 111. For the pixel 111, a plurality of gate lines 112 arranged in the row direction, a plurality of source lines 113 and a plurality of potential supply line 114 arranged in the column direction are provided. The output of each of the analog buffers 261, 262, and 263 in the corresponding row is connected to each of the source lines 113 (see FIG. 2). In each pixel 111, a selection transistor 301, a driving transistor 302, a storage capacitor 303, and an EL element 304 are included.

A gate of the selection transistor 301 is connected to the gate line 112, one of a first terminal and a second terminal of the selection transistor 301 is connected to the source line 113, and the other thereof is connected to a gate of the driving transistor 302. One of a first terminal and a second terminal of the driving transistor 302 is connected to the potential supply line 114 and the other thereof is connected to one electrode of the EL element 304. One electrode of the storage capacitor 303 is connected to the gate of the driving transistor 302 and the other electrode of the storage capacitor 303 is connected to the potential supply line 114. One electrode of the EL element 304 is connected to a source of the driving transistor 302 and the other electrode of the EL element 304 is connected to a fixed potential power source 306 provided in the pixel region 110. The EL element 304 includes two electrodes, an anode and a cathode, and an EL layer provided between these electrodes.

Next, operation of the pixel 111 of FIG. 5 will be described with reference to FIG. 4. In the selection period of the gate line Gm−1, the selection transistor 301 of the pixel 111 in the (m−1)-th row is selected to be turned on. The image data of the (m−1)-th row are written from the source line S1R, S1G, . . . S320B to the gate of the driving transistor 302 and the storage capacitor 303 of the pixel 111 in the (m−1)-th row. A current in accordance with a potential value of the gate of the driving transistor 302 is supplied to the EL element 304, whereby the EL element 304 emits light with a luminance in accordance with the current value. Accordingly, the pixel in the (m−1)-th row displays an image with the gray scale in accordance with the image data outputted from the source driver IC chip 131. Then, in the selection period of the gate line Gm, the selection transistor 301 in the (m−1)-th row is turned off and the selection transistor in the m-th row is turned on, whereby the image data is written to the pixel 111 in the m-th row. By repeating the above operation, the image data output from the source driver IC chip 131 is written to the pixel 111 in each row.

Here, the EL display device is described as an example of the display device 100; however, this embodiment can be employed to a liquid crystal display device. An example of the structure of the pixel 111 in a liquid crystal display device will be shown in FIG. 6. This embodiment can be applied to a liquid crystal display device including the pixel 111 of FIG. 6.

Figure 6:
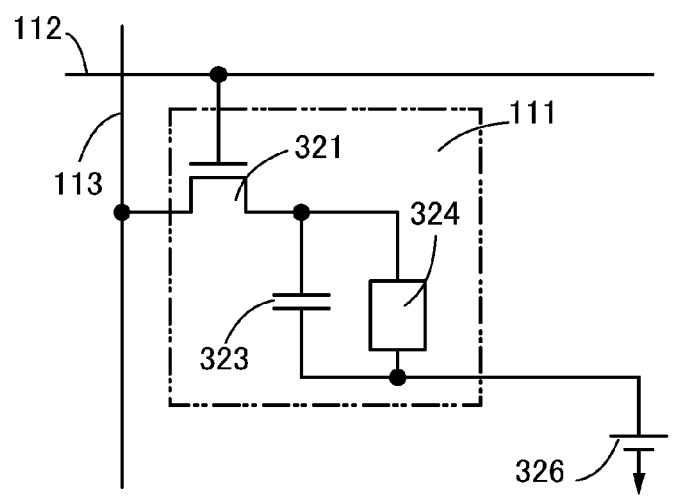
FIG. 6 is a circuit diagram showing an example of a structure of a pixel of a liquid crystal display device.

As shown in FIG. 6, each pixel 111 includes a selection transistor 321, a storage capacitor 323, and a liquid crystal element 324. The liquid crystal element 324 includes a pixel electrode, a counter electrode, and a liquid crystal material. The liquid crystal material is provided between the substrate 101 and the substrate 102. The pixel electrode is connected to the selection transistor 321. The counter electrode and one electrode of the storage capacitor 323 are connected to a fixed potential power source 326. In the case of the liquid crystal display device, similarly to the case of the EL display device, in a period during which the selection transistor 321 is selected and in the on state, image data is written from the source line 113 to the liquid crystal element 324, whereby, an image is displayed in the pixel 111 with a predetermined gray scale.

As described above, in this embodiment, the length of the period of writing data to each source line S1R, S1G, . . . S320B can be almost the same as the selection period of the gate line 112. That is, even when the number of output terminals of the source driver IC chip 131 becomes smaller than the number of the source line 113, a period enough to write data to each source line S1R, S1G, . . . S320B can be obtained.

As a result of employing this embodiment, cost can be reduced owing to reducing the number of the source driver IC chips and response time needed for performing the double-frame rate driving can be obtained. For example, a display device capable of displaying 3D images, a display device with high display quality by the double-frame rate driving, or the like can be provided at a low price.

Embodiment 2

In this embodiment, a transistor used in a display device 100 will be described.

In the display device 100, together with a transistor in a pixel region 110, at least an analog switch array 132, an analog memory array 133, and an analog buffer circuit 134 are preferably formed over a substrate 101. It is further preferably that a gate driver circuit 120 be also formed over the substrate 101. In this case, as the transistors included in these circuits (132 to 134, and 120), a transistor of which a channel formation region is formed using a crystalline semiconductor including an element of Group 14, such as microcrystalline silicon, polycrystalline silicon, or single crystal silicon, or an oxide semiconductor is preferable. In addition, the transistor with the same structure as these circuits can be used as a transistor in the pixel 111.

Transistors 221-223 of the analog switch array 132 used as a switch and transfer transistors 241-243 of an analog memory array 133 are desired not to leak charge therefrom; thus, channel formation regions of them are preferably formed using an oxide semiconductor. That is because an off-state current of a transistor formed using an oxide semiconductor is small as compared to that of a transistor formed using a semiconductor including an element of Group 14, so that leak of charge can be prevented.

In addition, a transistor including a semiconductor layer formed of single crystal silicon can be manufactured with the use of an SOI semiconductor substrate in which a glass substrate, a quartz substrate, a silicon wafer, or the like is used as a base substrate.

In this embodiment, with reference to FIGS. 7A to 7D and FIGS. 8A and 8B, an example of a structure of a transistor including a channel formation region formed using an oxide semiconductor will be described as an example of a structure of a transistor employed for the display device 100 transistor.

Figure 7A:
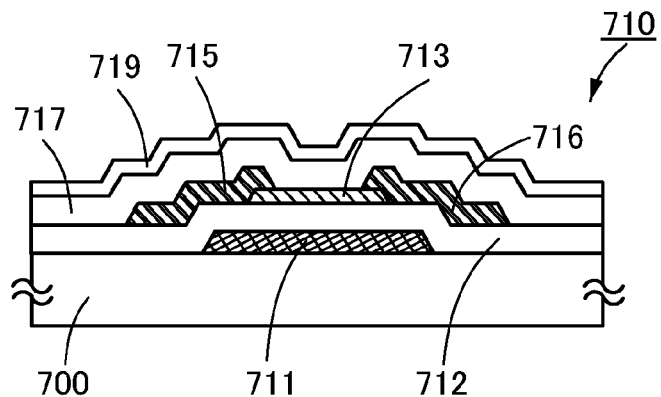
FIGS. 7A to 7D are cross-sectional views each showing an example of a structure of a transistor of a display device.
Figure 7B:
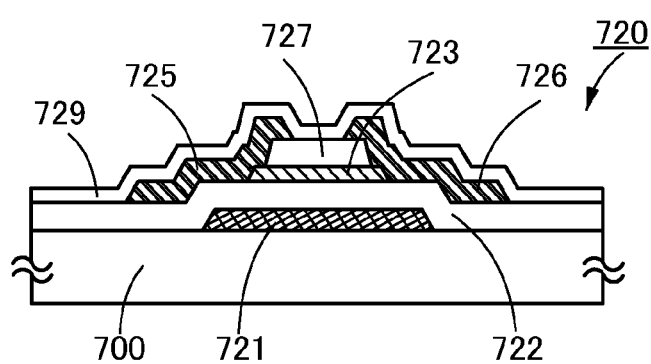
Figure 7C:
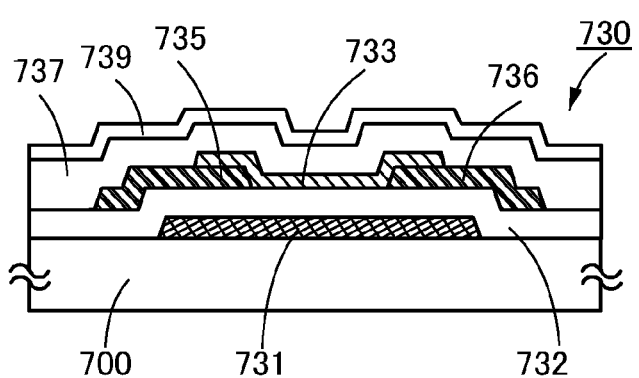
Figure 7D:
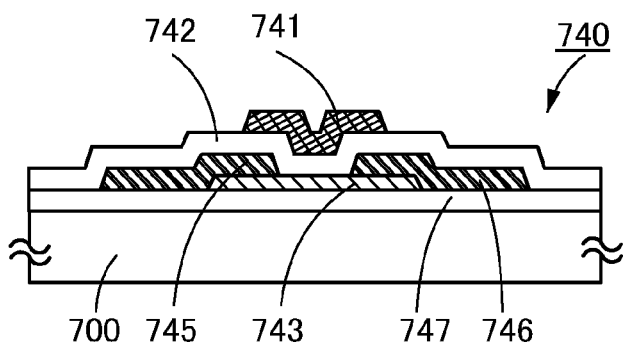
Figure 8A:
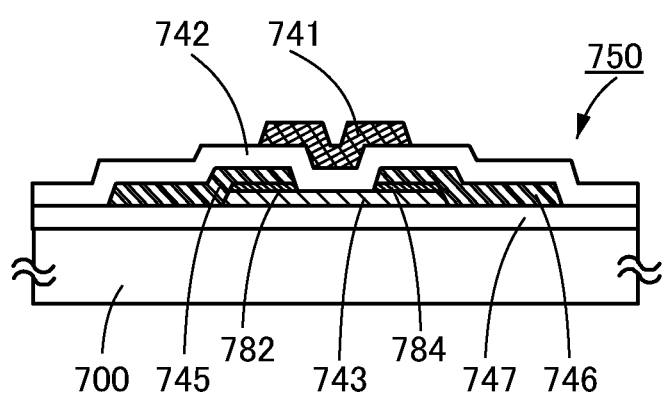
FIGS. 8A and 8B are cross-sectional views each showing an example of a structure of a transistor of a display device.
Figure 8B:
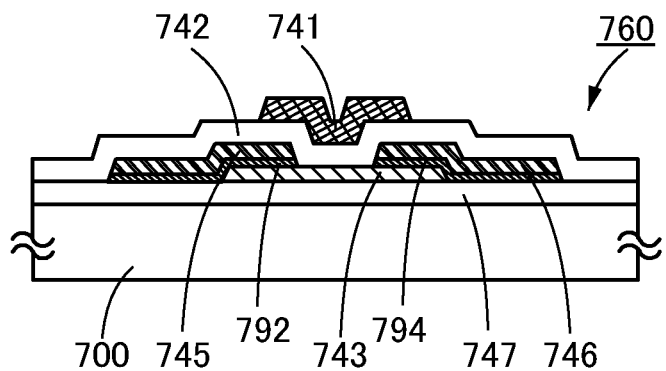

FIGS. 7A to 7D and FIGS. 8A and 8B are diagrams each explaining a cross section and a stacked structure of a transistor. Transistors 710, 720, and 730 illustrated in FIGS. 7A to 7C are examples of a bottom-gate transistor, and are also referred to as inverted staggered transistors. Transistor 740, 750, and 760 illustrated in FIG. 7D and FIGS. 8A and 8B are examples of a top-gate transistor.

As shown in FIG. 7A, the transistor 710 includes a conductive layer 711 provided over a substrate 700, an insulating layer 712 provided over the conductive layer 711, an oxide semiconductor layer 713 provided over the conductive layer 711 with the insulating layer 712 interposed therebetween, and a conductive layer 715 and a conductive layer 716 provided over parts of the oxide semiconductor layer 713. The transistor 710 includes an oxide insulating layer 717 which is in contact with the other part of the oxide semiconductor layer 713 (a portion in which the conductive layer 715 and the conductive layer 716 are not provided) and a protective insulating layer 719 over the oxide insulating layer 717. As the oxide insulating layer 717, an oxide insulating layer such as a silicon oxide layer can be used, for example.

The transistor 720 in FIG. 7B is a channel-protective transistor (also referred to as a channel-stop transistor). The transistor 720 includes a conductive layer 721 which is provided over the substrate 700, an insulating layer 722 which is provided over the conductive layer 721, an oxide semiconductor layer 723 which is provided over the conductive layer 721 with the insulating layer 722 provided therebetween, an insulating layer 727 which is provided over the conductive layer 721 with the insulating layer 722 and the oxide semiconductor layer 723 provided therebetween, and a conductive layer 725 and a conductive layer 726 which are each provided over part of the oxide semiconductor layer 723 and part of the insulating layer 727. A protective insulating layer 729 can be formed in the transistor 720.

In the transistor 720, when the conductive layer 721 is overlapped with part of or the entire oxide semiconductor layer 723, light entering the oxide semiconductor layer 723 can be suppressed. The insulating layer 727 has a function as a layer for protecting a channel formation layer of the transistor (also referred to as a channel protective layer).

As shown in FIG. 7C, the transistor 730 includes a conductive layer 731 which is provided over the substrate 700, an insulating layer 732 which is provided over the conductive layer 731, a conductive layer 735 and a conductive layer 736 which are each provided over part of the insulating layer 732, and an oxide semiconductor layer 733 which is provided over the conductive layer 731 with the insulating layer 732, the conductive layer 735, and the conductive layer 736 provided therebetween. In the transistor 730, an oxide insulating layer 737 in contact with a top surface and a side surface of the oxide semiconductor layer 733 and a protective insulating layer 739 provided over the oxide insulating layer 737 can be provided. As the oxide insulating layer 737, an oxide insulating layer such as a silicon oxide layer can be used, for example. When part of or the entire the oxide semiconductor layer 733 overlaps the conductive layer 731, light entering the oxide semiconductor layer 733 can be suppressed.

As shown in FIG. 7D, the transistor 740 includes an oxide semiconductor layer 743 provided over the substrate 700 with an insulating layer 747 interposed therebetween, a conductive layer 745 and a conductive layer 746 provided over parts of the oxide semiconductor layer 743, an insulating layer 742 provided over the oxide semiconductor layer 743, the conductive layer 745, and the conductive layer 746, and a conductive layer 741 provided over the oxide semiconductor layer 743 with the insulating layer 742 interposed therebetween.

The insulating layer 747 serves as a base layer of the transistor 740 which prevents diffusion of an impurity element from the substrate 700. As the insulating layer 747, for example, a single layer or a stacked layer selected from a silicon nitride layer, a silicon oxide layer, a silicon nitride oxide layer, a silicon oxynitride layer, an aluminum oxide layer, and an aluminum oxynitride layer is used. Alternatively, a stacked layer of the above layer and a layer of a material having a light-blocking property is used for the insulating layer 747. Further alternatively, a layer of a material having a light-blocking property is used for the insulating layer 747. The insulating layer 747 is formed using at least one light-blocking layer, whereby light entering the oxide semiconductor layer 743 can be suppressed.

Note that also in the transistors 710, 720, and 730, as in the transistor 740, the insulating layer 747 (a base layer) may be formed between the substrate 700 and the conductive layers (711, 721, and 731).

For example, as the substrate 700 over which each of the transistor 710, 720, 730, and 740 are formed, a glass substrate (e.g., barium borosilicate glass or aluminoborosilicate glass), a substrate formed of an insulator (e.g., a ceramic substrate, a quartz substrate, or a sapphire substrate), a crystallized glass substrate, a plastic substrate, or a semiconductor substrate (e.g., a silicon substrate) can be used.

Parts of the conductive layers (711, 721, 731, and 741) serve as gates of the transistors (710, 720, 730, and 740). As the conductive layers (711, 721, 731, and 741), for example, a layer of a metal material such as molybdenum, titanium, chromium, tantalum, tungsten, aluminum, copper, neodymium, or scandium, or a layer of an alloy material which contains any of the metal materials as its main component is used.

The insulating layers (712, 722, 732, and 742) include portions serving as gate insulating layers of the transistors (710, 720, 730, and 740). The insulating layers (712, 722, 732, and 742) are formed using a single layer or a stacked layer selected from a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, an aluminum gallium oxide layer, and the like.

Portions of the insulating layers (712, 722, 732, and 742) in contact with the oxide semiconductor layers (713, 723, 733, and 743) serve as gate insulating layers, and thus, these portions are preferably formed using an insulating layer containing oxygen. It is further preferable that the insulating layer containing oxygen include a region where the proportion of oxygen is larger than that in the stoichiometric composition (also referred to as an oxygen excessive region).

The gate insulating layer is the oxygen excessive region, and thus, transfer of oxygen from the oxide semiconductor layers (713, 723, 733, and 743) to the gate insulating layers can be prevented. In addition, oxygen can be supplied from the oxygen excessive regions in the gate insulating layers to the oxide semiconductor layers (713, 723, 733, and 743). Therefore, the oxide semiconductor layers (713, 723, 733, and 743) can be layers containing sufficient oxygen.

In addition, the insulating layers (712, 722, 732, and 742) are preferably deposited by a method by which impurities such as hydrogen and water do not enter the insulating layers. This is because, when impurities such as hydrogen and water are included in the insulating layers which are in contact with the oxide semiconductor layers (713, 723, 733, and 743), for example, the impurities such as hydrogen and water enter the oxide semiconductor layers (713, 723, 733, and 743) or oxygen in the oxide semiconductor layers (713, 723, 733, and 743) is extracted by the impurities such as hydrogen and water, so that the oxide semiconductor layers (713, 723, 733, and 743) might have lower resistance (have n-type conductivity) and a parasitic channel might be formed. The insulating layers (712, 722, 732, and 742) are preferably formed, for example, by a sputtering method, and a high-purity gas in which impurities such as hydrogen and water are removed is preferably used as a sputtering gas.

Note that treatment for supplying oxygen is preferably performed on the insulating layers (712, 722, 732, and 742). As examples of the treatment for supplying oxygen, heat treatment in an oxygen atmosphere, oxygen doping treatment, and the like can be given. Alternatively, oxygen may be added by exposing the insulating layers (712, 722, 732, and 742) to an oxygen ion accelerated by an electric field. Note that in this specification, "oxygen doping treatment" means addition of oxygen to a bulk, and the term "bulk" is used in order to clarify that oxygen is added not only to a surface of a film but also to the inside of the film. In addition, "oxygen doping" includes "oxygen plasma doping" in which oxygen which is made to be plasma is added to a bulk.

For example, in the case where an aluminum gallium oxide layer is used as at least one of the insulating layers 712, 722, 732, and 742, treatment for supplying oxygen such as oxygen doping treatment is performed; thus, the composition of aluminum gallium oxide can be $Ga_xAl_{2-x}O_{3+\alpha}$ ($0<x<2$, $0<\alpha<1$).

Alternatively, an oxygen gas or a mixed gas containing an inert gas (e.g., nitrogen or a rare gas such as argon) and oxygen is introduced during the deposition of the insulating layers (712, 722, 732, and 742) by a sputtering method, whereby oxygen excessive regions can be formed in the insulating layers (712, 722, 732, and 742).

Treatment for supplying oxygen is performed on the insulating layers (712, 722, 732, and 742), whereby regions where the proportion of oxygen is higher than that in the stoichiometric composition is formed, which are preferable as gate insulating layers. Providing such regions allow oxygen to be supplied to the oxide semiconductor layers (713, 723, 733, and 743), and accordingly, oxygen deficiency defects in the oxide semiconductor layers (713, 723, 733, and 743) or at the interfaces between the oxide semiconductor layers (713, 723, 733, and 743) and the insulating layers (712, 722, 732, and 742) can be reduced.

Channel formation regions are included in the oxide semiconductor layers (713, 723, 733, and 743). The oxide semiconductors used for the oxide semiconductor layers (713, 723, 733, and 743) preferably contains at least indium (In) or zinc (Zn). In particular, In and Zn are preferably contained. As a stabilizer for reducing variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

An In—Ga—Zn-based oxide semiconductor material has sufficiently high resistance when there is no electric field and thus off-state current can be sufficiently reduced. In addition, the In—Ga—Zn-based oxide semiconductor material has high field-effect mobility. In a transistor including an In—Sn—Zn-based oxide semiconductor material, the field-effect mobility can be three times or more as high as that of a transistor including the In—Ga—Zn-based oxide semiconductor material, and the threshold voltage can be easily set to be positive. These semiconductor materials are one of the materials that can be favorably used in a transistor of a semiconductor device according to an embodiment of the present invention.

Note that here, for example, an "In—Ga—Zn-based oxide" means an oxide containing In, Ga, and Zn as its main component, in which there is no particular limitation on the ratio of In:Ga:Zn. In addition to In, Ga, and Zn, a metal element may be contained.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having the appropriate composition may be used depending on necessary semiconductor characteristics (e.g., mobility, threshold voltage, and variation). In order to obtain necessary semiconductor characteristics, it is preferable that the carrier density, the impurity concentration, the defect density, the atomic ratio of a metal element to oxygen, the interatomic distance, the density, and the like be set to be appropriate.

For example, with the In—Sn—Zn-based oxide, a high mobility can be relatively easily obtained. However, the mobility can be increased by reducing the defect density in the bulk also in the case of using the In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide including In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained relatively easily, so that when a transistor is manufactured with the use of the oxide semiconductor, interface scattering can be reduced, and relatively high mobility can be obtained relatively easily.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

Note that the average surface roughness (Ra) is obtained by expanding, into three dimensions, center line average roughness that is defined by JIS B0601 so as to be able to apply it to a measurement surface. The Ra can be expressed as an "average value of the absolute values of deviations from a reference surface to a designated surface" and is defined by the following Formula (1).

[FORMULA 1]

$$Ra = \frac{1}{S_0} \int_{y_1}^{y_2} \int_{x_1}^{x_2} |f(x, y) - Z_0| dx dy \quad (1)$$

In the above formula, $S_0$ represents the area of a plane to be measured (a rectangular region which is defined by four points represented by coordinates $(x_1, y_1)$, $(x_1, y_2)$, $(x_2, y_1)$, and $(x_2, y_2)$), and $Z_0$ represents an average height of the plane to be measured. Ra can be measured using an atomic force microscope (AFM).

The oxide semiconductor layers (713, 723, 733, and 743) can be formed using an In—O-based metal oxide, a Sn—O-based metal oxide, or a Zn—O-based metal oxide, or the like. Alternatively, the oxide semiconductor layers (713, 723, 733, and 743) can be formed using an oxide semiconductor in which the metal oxide contains $SiO_2$.

The oxide semiconductor layers (713, 723, 733, and 743) can be formed using an oxide represented by the chemical formula $InMO_3(ZnO)_m$ (m>0). Here, M represents one or more metal elements selected from Ga, Al, Mn, and Co. For example, Ga, Ga and Al, Ga and Mn, or Ga and Co can be given as M.

Here, as the oxide semiconductor having crystallinity, an oxide including a crystal with c-axis alignment (also referred to as C-Axis Aligned Crystal (CAAC)), which has a triangular or hexagonal atomic arrangement when seen from the direction of an a-b plane, a surface, or an interface will be described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed or a surface of the CAAC). Alternatively, the normals of the a-b planes of the individual crystalline portions included in the CAAC may be aligned in one direction (e.g., a direction perpendicular to a surface of a substrate over which the CAAC is formed or a surface of the CAAC).

The CAAC becomes a conductor, a semiconductor, or an insulator depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a supporting substrate, and in which metal atoms are arranged in a layered manner or metal atoms and oxygen atoms (or nitrogen atoms) are arranged in a layered manner when a cross section of the film is observed.

An example of a crystal structure of the CAAC will be described in detail with reference to FIGS. 16A to 16E, FIGS. 17A to 17C, and FIGS. 18A to 18C. In FIGS. 16A to 16E the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 16A to 16E, O surrounded by a circle represents tetracoodianate O and O surrounded by a double circle represents tricoodenate O.

Figure 16A:
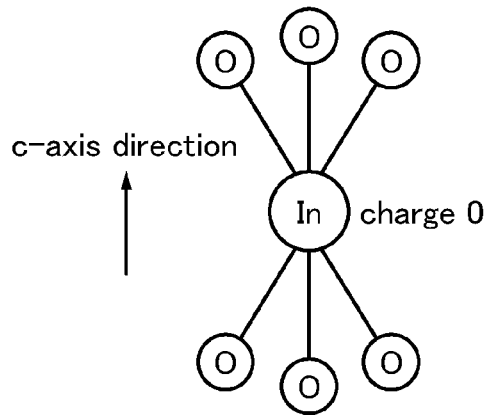
FIGS. 16A to 16E are diagrams showing a crystal structure of an oxide semiconductor.

FIG. 16A illustrates a crystal structure of an oxide semiconductor including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 16A is actually an octahedral structure, but is illustrated as a planar structure for simplicity. Note that three tetracoordinate O atoms exist in each of an upper half and a lower half in FIG. 16A. In the small group illustrated in FIG. 16A, electric charge is 0.

Figure 16D:
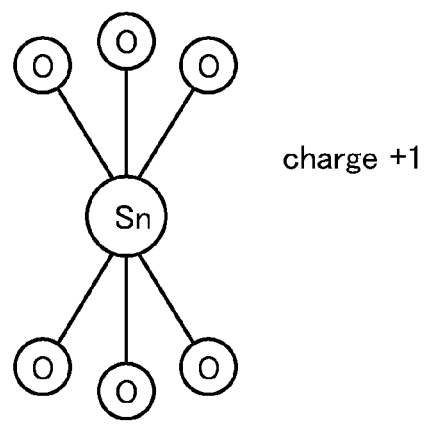
Figure 16B:
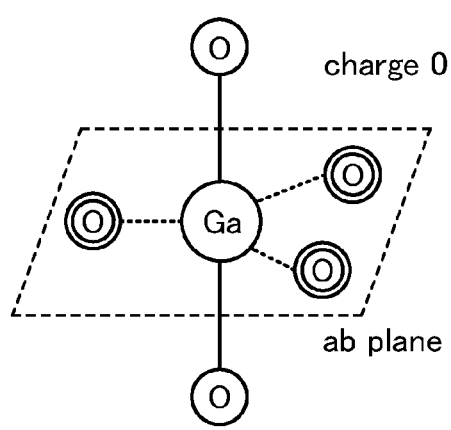

FIG. 16B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 16B. An In atom can also have the structure illustrated in FIG. 16B because an In atom can have five ligands. In the small group illustrated in FIG. 16B, electric charge is 0.

Figure 16E:
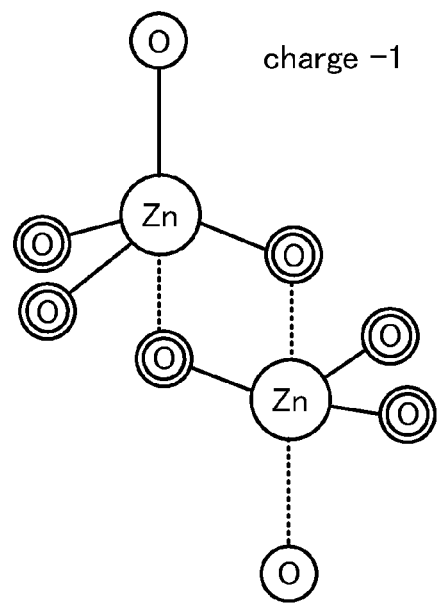
Figure 16C:
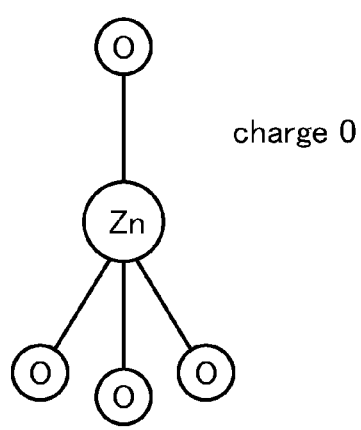

FIG. 16C illustrates a structure including one tetracoordinate Zn atom and four tetracoordinate O atoms proximate to the Zn atom. In FIG. 16C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 16C. In the small group illustrated in FIG. 16C, electric charge is 0.

FIG. 16D illustrates a structure including one hexacoordinate Sn atom and six tetracoordinate O atoms proximate to the Sn atom. In FIG. 16D, three tetracoordinate O atoms exist in each of an upper half and a lower half. In the small group illustrated in FIG. 16D, electric charge is +1.

FIG. 16E illustrates a small group including two Zn atoms. In FIG. 16E, one tetracoordinate O atom exists in each of an upper half and a lower half. In the small group illustrated in FIG. 16E, electric charge is −1.

Here, a plurality of small groups form a medium group, and a plurality of medium groups form a large group (also referred to as a unit cell).

Now, a rule of bonding between the small groups will be described. The three O atoms in the upper half with respect to the hexacoordinate In atom in FIG. 16A each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

Metal atoms having the above coordination numbers are bonded to another metal atom through a tetracoordinate O atom in the c-axis direction. In addition to the above, a medium group can be formed in a different manner by combining a plurality of small groups so that the total electric charge of the layered structure is 0.

FIG. 17A illustrates a model of a medium group included in a layered structure of an In—Sn—Zn—O-based material. FIG. 17B illustrates a large group including three medium groups. Note that FIG. 17C illustrates an atomic arrangement in the case where the layered structure in FIG. 17B is observed from the c-axis direction.

In FIG. 17A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 17A, one tetracoordinate O atom existing in each of an upper half and a lower half with respect to an In atom is denoted by circled 1. FIG. 17A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 17A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 16E can be given. For example, with one small group including two Zn atoms, electric charge of one small group including a Sn atom can be cancelled, so that the total electric charge of the layered structure can be 0.

When the large group illustrated in FIG. 17B is repeated, an In—Sn—Zn—O-based crystal $(In_2SnZn_3O_8)$ can be obtained. Note that a layered structure of the obtained In—Sn—Zn—O-based crystal can be expressed as a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

As an example, FIG. 18A illustrates a model of a medium group included in a layered structure of an In—Ga—Zn—O-based material.

In the medium group included in the layered structure of the In—Ga—Zn—O-based material in FIG. 18A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

FIG. 18B illustrates a large group including three medium groups. Note that FIG. 18C illustrates an atomic arrangement in the case where the layered structure in FIG. 18B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 18A but also a medium group in which the arrangement of the In atom, the Ga atom, and the Zn atom is different from that in FIG. 18A.

When the large group illustrated in FIG. 18B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 33A:
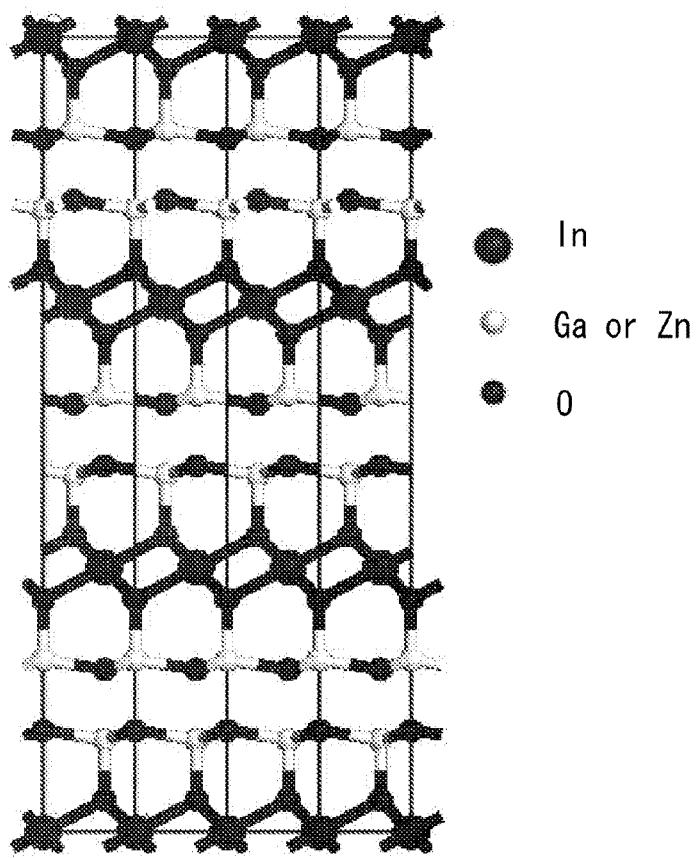
FIGS. 33A and 33B are diagrams showing a crystal structure of an oxide semiconductor.

In the case where n=1 ($InGaZnO_4$), a crystal structure illustrated in FIG. 33A can be obtained, for example. Note that in the crystal structure in FIG. 16B, since a Ga atom and an In atom each have five ligands as described in FIG. 16B, a structure in which Ga is replaced with In can be obtained.

Figure 33B:
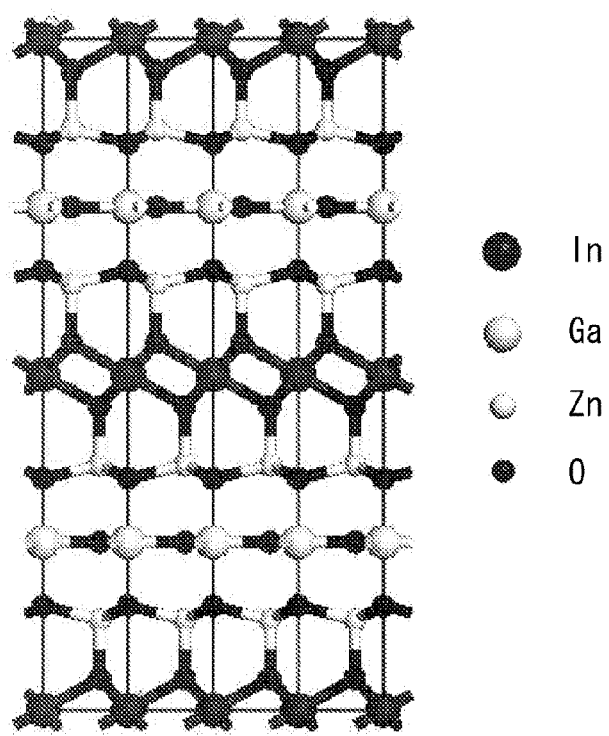

In the case where n=2 ($InGaZn_2O_5$), a crystal structure illustrated in FIG. 33B can be obtained, for example. Note that in the crystal structure in FIG. 16B, since a Ga atom and an In atom each have five ligands as described in FIG. 33B, a structure in which Ga is replaced with In can be obtained.

The conductive layers (715, 716, 725, 726, 735, 736, 745, and 746) each form a first terminal or a second terminal of a transistor and serve as a source or drain. The conductive layers (715, 716, 725, 726, 735, 736, 745, and 746) can be formed using a single layer or a stacked layer using any of the following: a layer of a metal material such as aluminum, chromium, copper, tantalum, titanium, molybdenum, or tungsten; and a layer of an alloy material which contains any of these metal materials as a main component.

For example, the conductive layers (715, 716, 725, 726, 735, 736, 745, and 746) are formed by stacking a layer containing a metal material such as aluminum and copper and a layer of a metal material with high melting point such as titanium, molybdenum, and tungsten. Alternatively, a layer of a metal material such as aluminum and copper is formed between a plurality of layers of a metal material with high melting point. In the case of using an aluminum layer as the conductive layers (715, 716, 725, 726, 735, 736, 745, and 746), an element which prevents generation of hillocks or whiskers (e.g., silicon, neodymium, or scandium) may be added to improve heat resistance.

Further alternatively, as the conductive layers (715, 716, 725, 726, 735, 736, 745, and 746), a metal oxide layer of indium oxide ($In_2O_3$), tin oxide ($SnO_2$), zinc oxide (ZnO), an alloy of indium oxide and tin oxide ($In_2O_3$—$SnO_2$), an alloy of indium oxide and zinc oxide ($In_2O_3$—ZnO), or the like, or a metal oxide layer in which silicon oxide is included in any of these metal oxide materials may be formed.

As the protective insulating layers (719, 729, and 739) of the bottom-gate transistors (710, 720, and 730), an inorganic insulating layer such as a silicon nitride layer, a aluminum nitride layer, a silicon nitride oxide layer, or an aluminum nitride oxide layer can be used.

In the top-gate transistor 740, an oxide conductive layer which functions as a source region and a drain region may be provided as a buffer layer between the oxide semiconductor layer 743 and the conductive layer 745 and between the oxide semiconductor layer 743 and the conductive layer 746. The provision of the oxide conductive layer serving as the source and drain regions makes it possible to decrease the resistance of the source and drain regions and to operate the transistor at high speed. Further, withstand voltage of the transistor can be improved. A structural example of such a transistor provided the oxide conductive layer is shown in FIGS. 8A and 8B.

As shown in FIG. 8A, in the transistor 750, an oxide conductive layer 782 and an oxide conductive layer 784 serving as a source region and a drain region are formed between the oxide semiconductor layer 743, and the conductive layers 745 and 746.

The oxide conductive layer 782 and the oxide conductive layer 784 can be formed in the following manner: an oxide semiconductor film and an oxide conductive film are stacked, and the stacked film is etched using one photomask. By the etching, an island-shaped oxide semiconductor layer 743 is formed from the oxide semiconductor film, and the oxide conductive film is formed to have an island shape over the oxide semiconductor layer 743. Next, the conductive layers 745 and 746 are formed. Then, the island-shaped oxide conductive film is etched with the use of the conductive layers 745 and 746 as a mask. By the etching, the oxide conductive layer 782 and the oxide conductive layer 784 are formed.

As shown in FIG. 8B, in the transistor 760, an oxide conductive layer 792 and an oxide conductive layer 794 serving as a source region and a drain region are formed between the oxide semiconductor layer 743 and the conductive layer 745 and the conductive layer 746. The oxide conductive layers 792 and 794 can be formed in the following manner: an oxide conductive film is formed over the oxide semiconductor layer 743 and a metal conductive film is formed thereover. Next, the oxide conductive film and the metal conductive film are etched with the use of photomasks formed in the same photolithography step. As a result, the oxide conductive layer 792 and the oxide conductive layer 794 are formed from the oxide conductive film and the conductive layer 745 and the conductive layer 746 are formed from the metal conductive film.

Note that in the etching treatment of the oxide conductive layers (782, 784, 792, and 794) in manufacturing the transistors 750 and 760, in order to prevent excessive etching of the oxide semiconductor layer 743, etching conditions (the kind of etchant, the concentration, the etching time, and the like) are adjusted as appropriate.

For the formation of the oxide conductive films forming the oxide conductive layers (782, 784, 792, and 794), a sputtering method, a vacuum evaporation method (such as an electron beam evaporation method), an arc discharge ion plating method, or a spray method is used. As a material of the oxide conductive layers, zinc oxide, zinc aluminum oxide, zinc aluminum oxynitride, zinc gallium oxide, indium tin oxide containing silicon oxide, or the like can be used. Alternatively, the above materials may include silicon oxide.

This embodiment can be implemented in combination with any of the other embodiments or examples as appropriate.

Embodiment 3

An example of a method of manufacturing an oxide semiconductor layer which is used as a semiconductor layer of a transistor in a display device 100 will be described with reference to FIGS. 9A to 9E. Here, a method of forming a semiconductor layer with a stacked structure of a first crystalline oxide semiconductor layer and a second crystalline oxide semiconductor layer which is stacked over the first crystalline oxide semiconductor layer and is thicker than the first crystalline oxide semiconductor layer will be described.

Figure 9A:
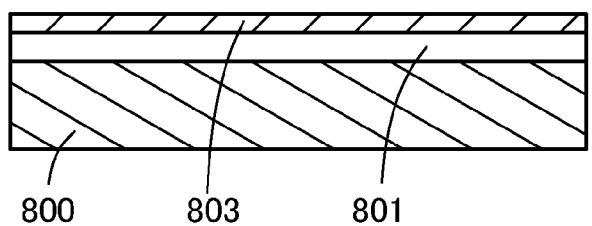
FIGS. 9A to 9E are cross-sectional views showing a manufacturing method of an oxide semiconductor layer used in the transistor of the display device in FIG. 1.
Figure 9B:
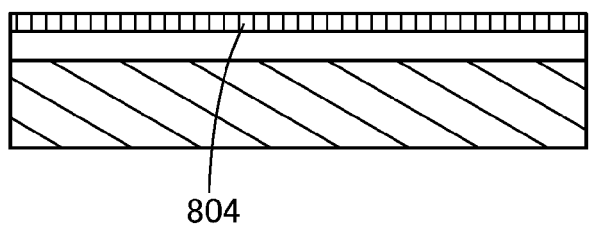
Figure 9C:
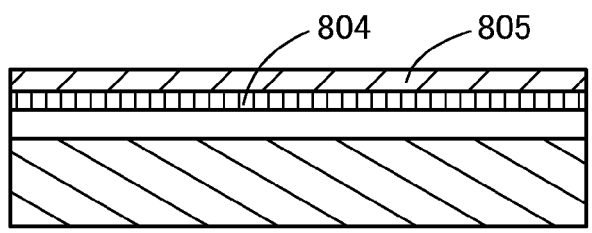

An insulating layer 801 is formed over a substrate 800 (see FIG. 9A). In this embodiment, as the insulating layer 801, an oxide insulating layer having a thickness of larger than or equal to 50 nm and smaller than or equal to 600 nm is formed by a PCVD method or a sputtering method. As the insulating layer 801, a single layer selected from a silicon oxide film, a gallium oxide film, an aluminum oxide film, a silicon oxynitride film, an aluminum oxynitride film, and a silicon nitride oxide film or a stack of any of these films can be used.

Next, a first oxide semiconductor film 803 with a thickness greater than or equal to 1 nm and less than or equal to 10 nm is formed over the insulating layer 801. The first oxide semiconductor film 803 is formed by a sputtering method, and the substrate temperature in the film formation by a sputtering method is set to be higher than or equal to 200° C. and lower than or equal to 400° C. The atmosphere is an oxide and/or argon atmosphere.

In this embodiment, the first oxide semiconductor film 803 is formed to a thickness of 5 nm under conditions that a target for an oxide semiconductor (a target for an In—Ga—Zn—O-based oxide semiconductor ($In_2O_3$:$Ga_2O_3$:ZnO=1:1:2 [molar ratio])) is used, the distance between a substrate and the target is 160 mm, the substrate temperature is 250° C., the pressure is 0.4 Pa, and the direct current (DC) power source is 0.5 kW (see FIG. 9A).

An In—Sn—Zn-based oxide semiconductor can be referred to as ITZO. An oxide target which has a composition ration of In:Sn:Zn=1:2:2, 2:1:3, 1:1:1, 20:45:35, or the like in an atomic ratio is used. Such ITZO can be used as an oxide semiconductor.

Next, first heat treatment is performed on the first oxide semiconductor film 803. The first heat treatment is performed in a nitrogen atmosphere or a dry air atmosphere, and the treatment temperature is higher than or equal to 400° C. and lower than or equal to 750° C. By the first heat treatment, a first crystalline oxide semiconductor layer 804 is formed (see FIG. 9B).

Depending on the temperature of the first heat treatment, the first heat treatment causes crystallization from the surface of the first crystalline oxide semiconductor film 803 and crystal grows from the film surface toward the inside of the film; thus, c-axis aligned crystal is obtained. By the first heat treatment, a large amount of zinc and oxide is concentrated at the surface of the first crystalline oxide semiconductor film 803, and one or a plurality of graphene-type two-dimensional crystals including zinc and oxygen, the upper flat surface each of which is hexagonal, is formed on an outermost surface. The growth of these crystals in the thickness direction of the first oxide semiconductor film proceeds and the crystals overlap with each other and stacked. In the case where the temperature of the first heat treatment is increased, the crystal growth proceeds from the surface to the inside thereof and further the inside to the bottom.

By the first heat treatment, oxygen in the insulating layer 801 (the oxide insulating layer) is diffused into the interface with the first oxide semiconductor film 803 or the periphery of the interface (a region with a distance±5 nm from the interface), whereby the first crystalline oxide semiconductor layer 804 with oxygen deficiency reduced can be obtained. Therefore, it is preferable that the insulating layer 801 used as a base insulating layer contains a large amount of oxygen, which exceeds at least the stoichiometric composition, in (a bulk of) the layer and/or the interface with the first oxide semiconductor film 803.

Then, a second oxide semiconductor film 805 with a thickness greater than 10 nm is formed over the first crystalline oxide semiconductor layer 804. The second oxide semiconductor film 805 is formed by sputtering, and the substrate temperature in the film formation is set to be higher than or equal to 200° C. and lower than or equal to 400° C. By setting the substrate temperature in the film formation to be higher than or equal to 200° C. and lower than or equal to 400° C., precursors can be arranged in the oxide semiconductor formed over and in contact with the surface of the first crystalline oxide semiconductor layer 804, so that orderliness of atoms in the second crystalline oxide semiconductor film 805 can be obtained.

In this embodiment, the second oxide semiconductor film 805 is deposited to a thickness of 25 nm under conditions where a target for an oxide semiconductor (a target for an In—Ga—Zn—O-based oxide semiconductor ($In_2O_3$:$Ga_2O_3$:ZnO=1:1:2 [molar ratio])) is used, the distance between the substrate and the target is 170 mm, the substrate temperature is 400° C., the pressure is 0.4 Pa, and the direct current (DC) power is 0.5 kW. The atmosphere is an oxygen and/or an argon atmosphere (see FIG. 9C).

Then, an atmosphere in a chamber where the substrate 800 is placed is set to a nitrogen atmosphere or dry air, and second heat treatment is performed on the second oxide semiconductor film 805. The temperature of the second heat treatment is higher than or equal to 400° C. and lower than or equal to 750° C. By the second heat treatment, a second crystalline oxide semiconductor layer 806 is formed in the thickness direction of the second oxide semiconductor film 805, in which crystal growth proceeds from the bottom to the inside, using the first crystalline oxide semiconductor layer 804 as a nucleus (see FIG. 9D). In addition, by the second heat treatment, the density of the second crystalline oxide semiconductor layer 806 can be higher and defects in the second crystalline oxide semiconductor layer 806 can be reduced.

Figure 9D:
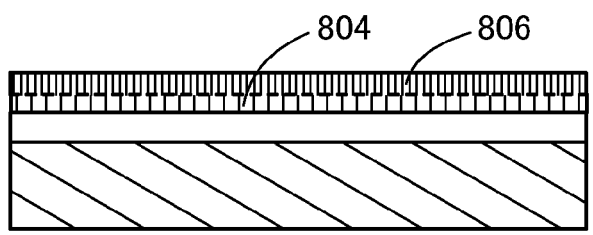

Note that in FIG. 9D, the first crystalline oxide semiconductor layer 804 and the second crystalline oxide semiconductor layer 806 are indicated with different hatching pattern for convenience of explanation; however, a stack of the first crystalline oxide semiconductor layer 804 and the second crystalline oxide semiconductor layer 806 does not have a clear interface.

In this embodiment, it is preferable that steps from the formation of the insulating layer 801 to the second heat treatment be successively performed without exposure to the air. The steps from the formation of the insulating layer 801 to the second heat treatment are preferably performed in an atmosphere which is controlled to include little hydrogen and moisture (such as an inert gas atmosphere, a reduced-pressure atmosphere, or a dry-air atmosphere); in terms of moisture, for example, a dry nitrogen atmosphere with a dew point of −40° C. or lower, preferably a dew point of −50° C. or lower may be employed.

Figure 9E:
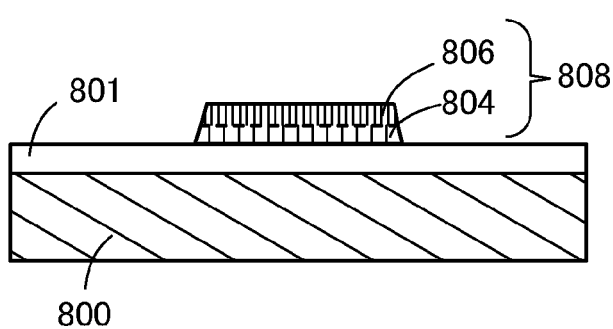

Next, the stacked layer of the first crystalline oxide semiconductor layer 804 and the second crystalline oxide semiconductor layer 806 is processed to form an oxide semiconductor layer 808 (see FIG. 9E).

For example, a mask having a desired shape is formed over the second crystalline oxide semiconductor layer 806 and then the first crystalline oxide semiconductor layer 804 and the second crystalline oxide semiconductor layer 806 are etched, so that the oxide semiconductor layer 808 can be formed. The mask may be formed by a method such as photolithography. Alternatively, the mask may be formed by an ink jet method or the like. Dry etching, wet etching, or both wet etching and dry etching in combination can be used.

Note that although an example in which the oxide semiconductor layer 808 is formed over the substrate 800 with the insulating layer 801 provided therebetween is described in this embodiment, another layer is formed between the substrate 800 and the oxide semiconductor layer 808 as appropriate according to a structure of a transistor. For example, in the case where the bottom-gate transistors (710, 720, and 730) as shown in FIGS. 7A to 7C is formed, a gate electrode layer and a gate insulating layer are formed and the oxide semiconductor layer 808 is formed over the gate insulating layer.

In addition, one of features of this embodiment is that the first crystalline oxide semiconductor layer 804 and the second crystalline oxide semiconductor layer 806 are c-axis aligned. The first crystalline oxide semiconductor layer 804 and the second crystalline oxide semiconductor layer 806 are crystalline oxide semiconductors having c-axis alignment (also referred to as c-axis aligned crystalline (CAAC) oxide semiconductors), which has neither a single crystal structure nor an amorphous structure. The first crystalline oxide semiconductor layer 804 and the second crystalline oxide semiconductor layer 806 partly include a crystal grain boundary.

In order to obtain CAAC, it is important to form hexagonal crystals in an initial stage of deposition of the oxide semiconductor films (803 and 805) and to cause crystal growth from the hexagonal crystals as cores. In order to do that, the heating temperature of the substrate 800 in the deposition of the oxide semiconductor films (803 and 805) may be higher than or equal to 100° C. and lower than or equal to 500° C. It is preferable that the temperature be higher than or equal to 200° C. and lower than or equal to 400° C., further preferably higher than or equal to 250° C. and lower than or equal to 300° C. In addition, the oxide semiconductor films (803 and 805) are subjected to heat treatment at a temperature higher than the substrate heating temperature in the deposition. Therefore, micro defects in the film and defects at the interface of a stacked layer can be compensated.

Note that the first crystalline oxide semiconductor layer 804 and the second crystalline oxide semiconductor layer 806 are each formed using an oxide material including at least Zn. For example, a four-component metal oxide such as an In—Al—Ga—Zn—O-based material or an In—Sn—Ga—Zn—O-based material; a three-component metal oxide such as an In—Ga—Zn—O-based material, an In—Al—Zn—O-based material, an In—Sn—Zn—O-based material, a Sn—Ga—Zn—O-based material, an Al—Ga—Zn—O-based material, or a Sn—Al—Zn—O-based material; a two-component metal oxide such as an In—Zn—O-based material, a Sn—Zn—O-based material, an Al—Zn—O-based material, or a Zn—Mg—O-based material; a Zn—O-based material; or the like can be used. An In—Si—Ga—Zn—O-based material, an In—Ga—B—Zn—O-based material, or an In—B—Zn—O-based material may be used. In addition, the above materials may contain $SiO_2$. Here, for example, an In—Ga—Zn—O-based material means an oxide film containing indium (In), gallium (Ga), and zinc (Zn), and there is no particular limitation on the composition ratio thereof. Further, the In—Ga—Zn—O-based oxide semiconductor may contain an element other than In, Ga, and Zn.

By using the oxide semiconductor layer 808 for the channel formation region of the transistor, a transistor having stable electric characteristics and high reliability can be realized. Note that the structure of the oxide semiconductor layer 808 is not limited to the two-layer stacked structure of the first crystalline oxide semiconductor layer 804 and the second crystalline oxide semiconductor layer 806: a crystalline oxide semiconductor film may be stacked three or more by repeating the formation of a crystalline oxide semiconductor film and heat treatment.

This embodiment can be combined with the structure described in any of the other embodiments and an example as appropriate.

Embodiment 4

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following Formula (2).

[FORMULA 2]

$$\mu = \mu_0 \exp\left(-\frac{E}{kT}\right) \quad (2)$$

Here, E represents the height of the potential barrier, k represents the Boltzmann constant, and T represents the absolute temperature. When the potential barrier is assumed to be attributed to a defect, the height of the potential barrier can be expressed as the following Formula (3) according to the Levinson model.

[FORMULA 3]

$$E = \frac{e^2 N^2}{8\varepsilon n} = \frac{e^3 N^2 t}{8\varepsilon C_{ox} V_g} \quad (3)$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed as the following Formula (4).

[FORMULA 4]

$$I_d = \frac{W\mu V_g V_d C_{ox}}{L} \exp\left(-\frac{E}{kT}\right) \quad (4)$$

Here, L represents the channel length and W represents the channel width, and L and W are each 10 µm. In addition, $V_d$ represents the drain voltage. When dividing both sides of the above equation by $V_g$ and then taking logarithms of both sides, the following Formula (5) can be obtained.

[FORMULA 5]

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad (5)$$

The right side of Formula 5 is a function of $V_g$. From the formula, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/cm^2$.

On the basis of the defect density obtained in this manner, or the like, $\mu_0$ can be calculated to be 120 cm²/Vs from Formula 2 and Formula 3. The measured mobility of an In—Sn—Zn oxide including a defect is approximately 35 cm²/Vs. However, assuming that no defect exists inside the semiconductor and at the interface between the semiconductor and an insulating film, the mobility $\mu_0$ of the oxide semiconductor is expected to be 120 cm²/Vs.

Note that even when no defect exists inside a semiconductor, scattering at an interface between a channel and a gate insulating layer affects the transport property of the transistor. In other words, the mobility $\mu_1$ at a position that is distance x away from the interface between the channel and the gate insulating layer can be expressed as the following Formula (6).

[FORMULA 6]

$$\frac{1}{\mu_1} = \frac{1}{\mu_0} + \frac{D}{B}\exp\left(-\frac{x}{G}\right) \quad (6)$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage is increased), the second term of Formula 6 is increased and accordingly the mobility $\mu_1$ is decreased.

Figure 19:
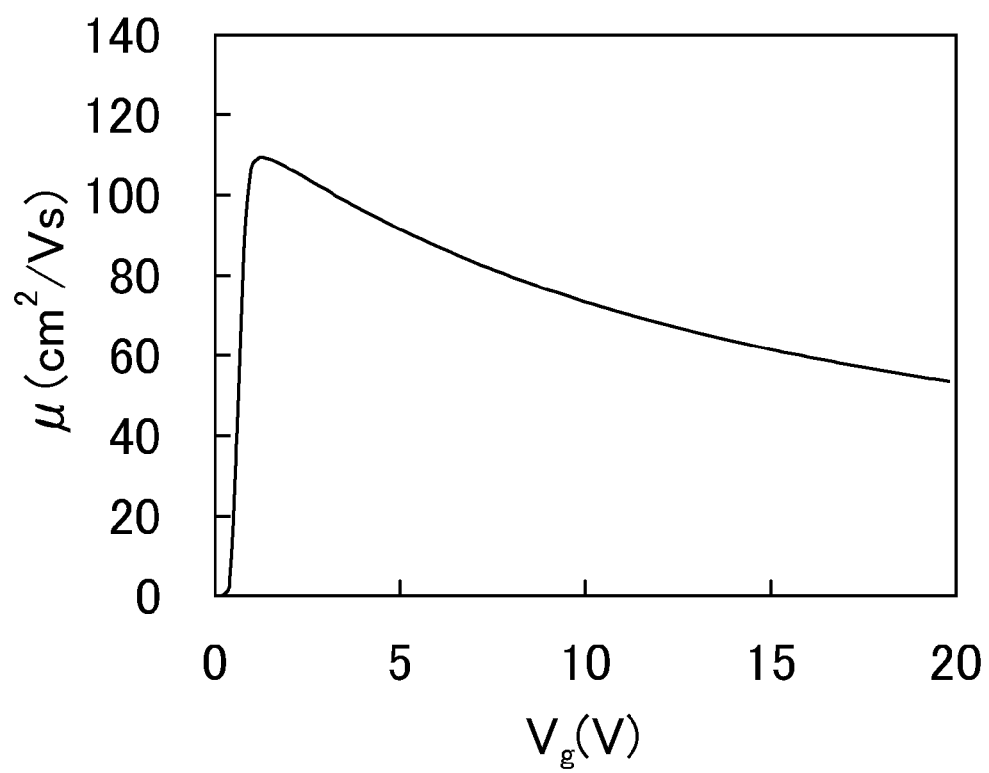
FIG. 19 shows the gate voltage dependence of mobility obtained by calculation.

Calculation results of the mobility $\mu_2$ of a transistor whose channel includes an ideal oxide semiconductor without a defect inside the semiconductor are shown in FIG. 19. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 µm, and the drain voltage $V_d$ was assumed to be 0.1 V.

As shown in FIG. 19, the mobility has a peak of more than 100 cm²/Vs at a gate voltage that is a little over 1 V and is decreased as the gate voltage becomes higher because the influence of interface scattering is increased. Note that in order to reduce interface scattering, it is desirable that a surface of the semiconductor layer be flat at the atomic level (atomic layer flatness).

Calculation results of characteristics of minute transistors which are manufactured using an oxide semiconductor having such a mobility are shown in FIGS. 20A to 20C, FIGS. 21A to 21C, and FIGS. 22A to 22C. FIGS. 23A and 23B illustrate cross-sectional structures of the transistors used for the calculation. The transistors illustrated in FIGS. 23A and 23B each include a semiconductor region 1030a and a semiconductor region 1030c which have n⁺-type conductivity in an oxide semiconductor layer. The resistivities of the semiconductor region 1030a and the semiconductor region 1030c are $2 \times 10^{-3}$ Ωcm.

The transistor illustrated in FIG. 23A is formed over a base insulating layer 1010 and an embedded insulator 1020 which is embedded in the base insulating layer 1010 and formed of aluminum oxide. The transistor includes the semiconductor region 1030a, the semiconductor region 1030c, an intrinsic semiconductor region 1030b serving as a channel formation region therebetween, and a gate 1050. The width of the gate 1050 is 33 nm.

A gate insulating layer 1040 is formed between the gate 1050 and the semiconductor region 1030b. In addition, a sidewall insulating layer 1060a and a sidewall insulating layer 1060b are formed on both side surfaces of the gate 1050, and an insulator 1070 is formed over the gate 1050 so as to prevent a short circuit between the gate 1050 and another wiring. The sidewall insulating layer has a width of 5 nm. A source 1080a and a drain 1080b are provided in contact with the semiconductor region 1030a and the semiconductor region 1030c, respectively. Note that the channel width of this transistor is 40 nm.

The transistor of FIG. 23B is the same as the transistor of FIG. 23A in that it is formed over the base insulating layer 1010 and the embedded insulator 1020 formed of aluminum oxide and that it includes the semiconductor region 1030a, the semiconductor region 1030c, the intrinsic semiconductor region 1030b provided therebetween, the gate 1050 having a width of 33 nm, the gate insulating layer 1040, the sidewall insulating layer 1060a, the sidewall insulating layer 1060b, the insulator 1070, the source 1080a, and the drain 1080b.

The transistor illustrated in FIG. 23A is different from the transistor illustrated in FIG. 23B in the conductivity type of semiconductor regions under the sidewall insulating layer 1060a and the sidewall insulating layer 1060b. In the transistor illustrated in FIG. 23A, the semiconductor regions under the sidewall insulating layer 1060a and the sidewall insulating layer 1060b are part of the semiconductor region 1030a having n⁺-type conductivity and part of the semiconductor region 1030c having n⁺-type conductivity, whereas in the transistor illustrated in FIG. 23B, the semiconductor regions under the sidewall insulating layer 1060a and the sidewall insulating layer 1060b are part of the intrinsic semiconductor region 1030b. In other words, in the semiconductor layer of FIG. 23B, a region having a width of $L_{off}$ which overlaps with neither the semiconductor region 1030a (the semiconductor region 1030c) nor the gate 1050 is provided. This region is called an offset region, and the width $L_{off}$ is called an offset length. As is seen from the drawing, the offset length is equal to the width of the sidewall insulating layer 1060a (the sidewall insulating layer 1060b).

Figure 20A:
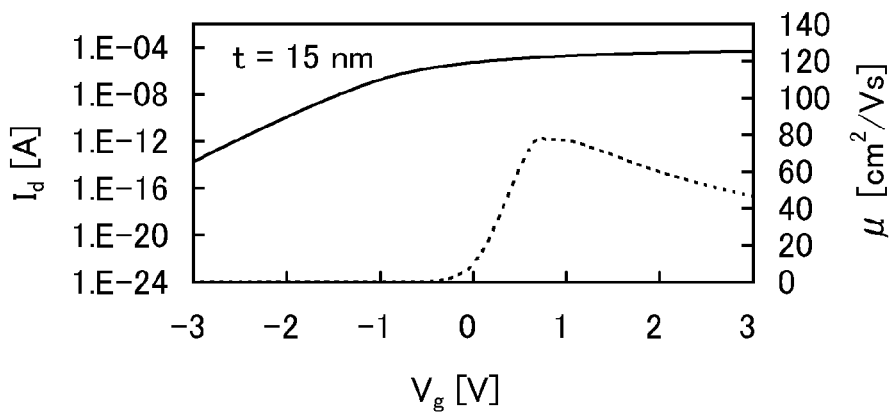
FIGS. 20A to 20C show the gate voltage dependence of drain current and mobility obtained by calculation.
Figure 20B:
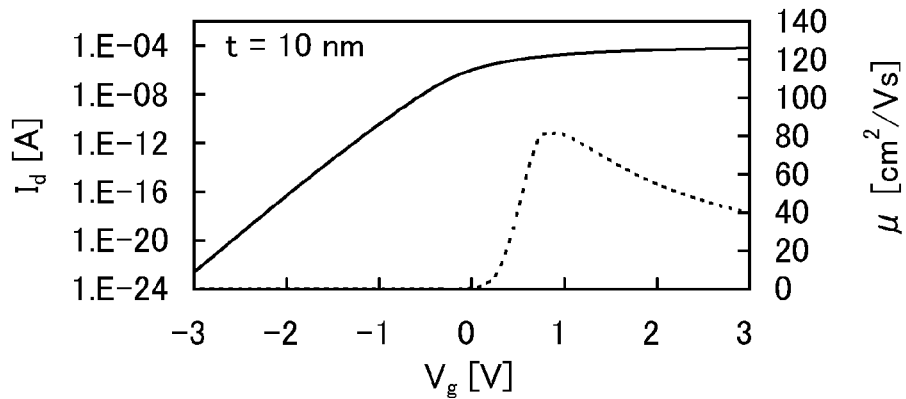
Figure 20C:
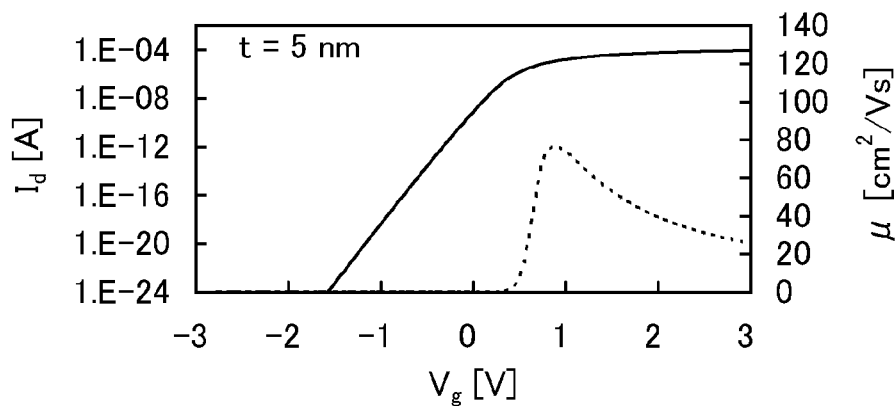

The other parameters used in calculation are as described above. For the calculation, device simulation software Sentaurus Device manufactured by Synopsys, Inc. was used. FIGS. 20A to 20C show the gate voltage ($V_g$: a potential difference between the gate and the source) dependence of the drain current ($I_d$, a solid line) and the mobility ($\mu$, a dotted line) of the transistor having the structure illustrated in FIG. 23A. The drain current $I_d$ is obtained by calculation under the assumption that the drain voltage (a potential difference between the drain and the source) is +1 V and the mobility $\mu$ is obtained by calculation under the assumption that the drain voltage is +0.1 V.

FIG. 20A shows the gate voltage dependence of the transistor in the case where the thickness of the gate insulating layer is 15 nm, FIG. 20B shows that of the transistor in the case where the thickness of the gate insulating layer is 10 nm, and FIG. 20C shows that of the transistor in the case where the thickness of the gate insulating layer is 5 nm. As the gate insulating layer is thinner, particularly, the drain current $I_d$ in an off state (off-state current) is significantly decreased. In contrast, there is no noticeable change in the peak value of the mobility $\mu$ and the drain current $I_d$ in an on state (on-state current). The graphs show that the drain current exceeds 10 $\mu$A, which is required in a memory element and the like, at a gate voltage of around 1 V.

Figure 21A:
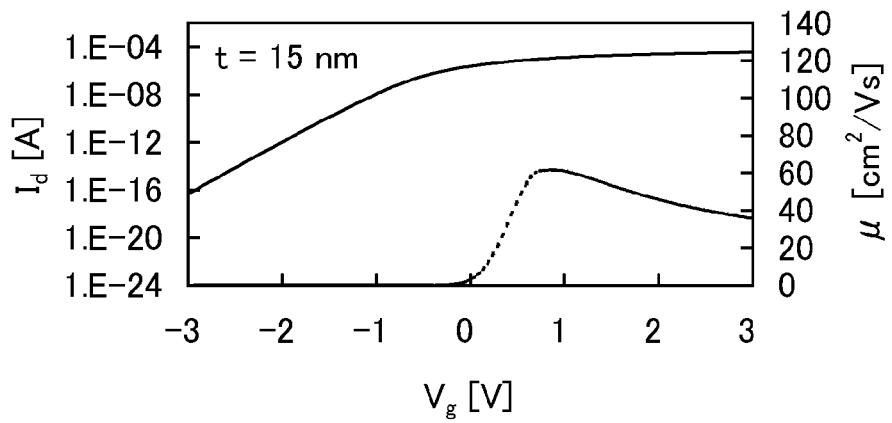
FIGS. 21A to 21C show the gate voltage dependence of drain current and mobility obtained by calculation.
Figure 21B:
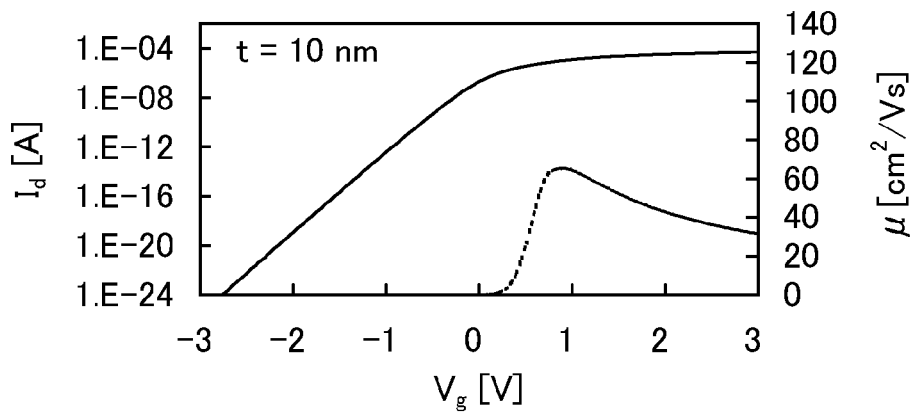
Figure 21C:
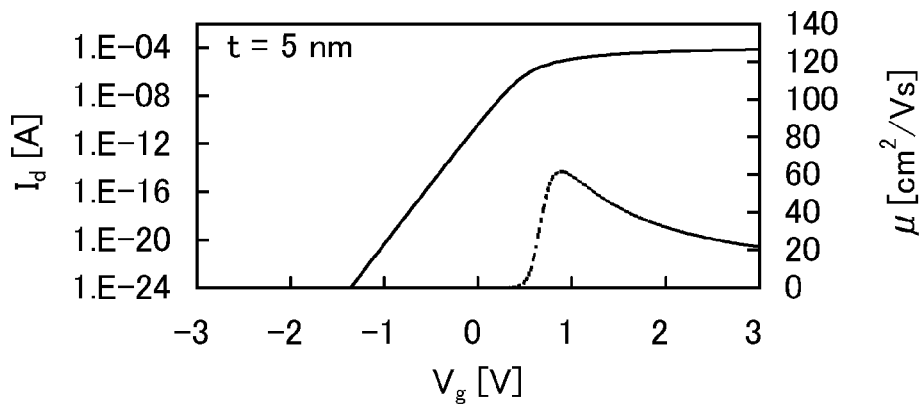

FIGS. 21A to 21C show the gate voltage $V_g$ dependence of the drain current $I_d$ (a solid line) and the mobility $\mu$ (a dotted line) of the transistor having the structure illustrated in FIG. 23B where the offset length $L_{off}$ is 5 nm. The drain current $I_d$ is obtained by calculation under the assumption that the drain voltage is +1 V and the mobility $\mu$ is obtained by calculation under the assumption that the drain voltage is +0.1 V. FIG. 21A shows the gate voltage dependence of the transistor in the case where the thickness of the gate insulating layer is 15 nm, FIG. 21B shows that of the transistor in the case where the thickness of the gate insulating layer is 10 nm, and FIG. 21C shows that of the transistor in the case where the thickness of the gate insulating layer is 5 nm.

Figure 22A:
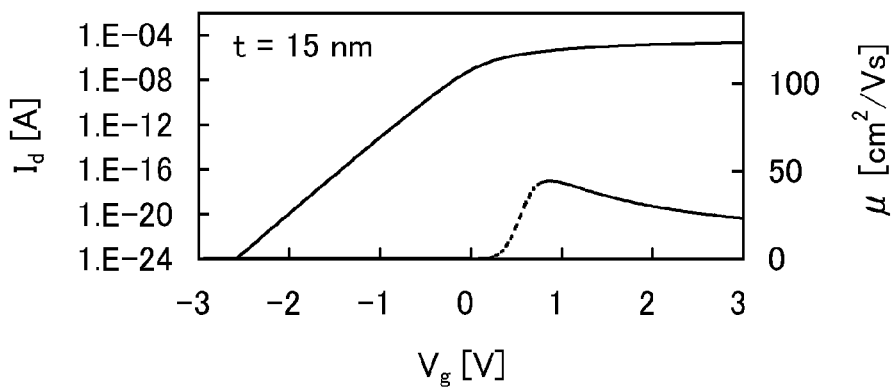
FIGS. 22A to 22C show the gate voltage dependence of drain current and mobility obtained by calculation.
Figure 22B:
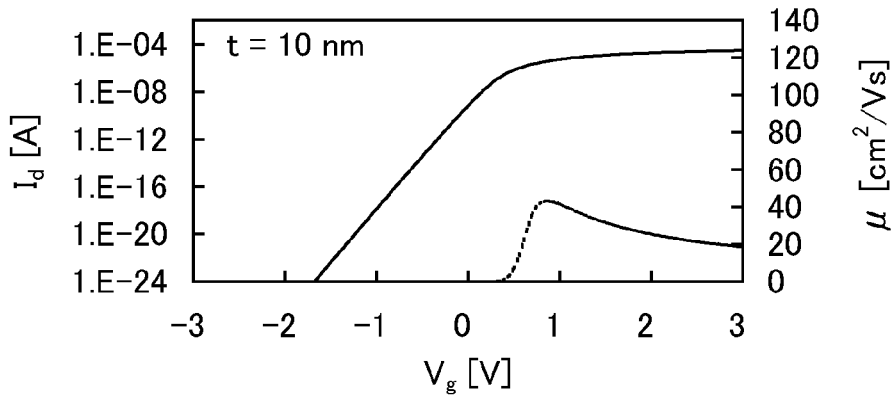
Figure 22C:
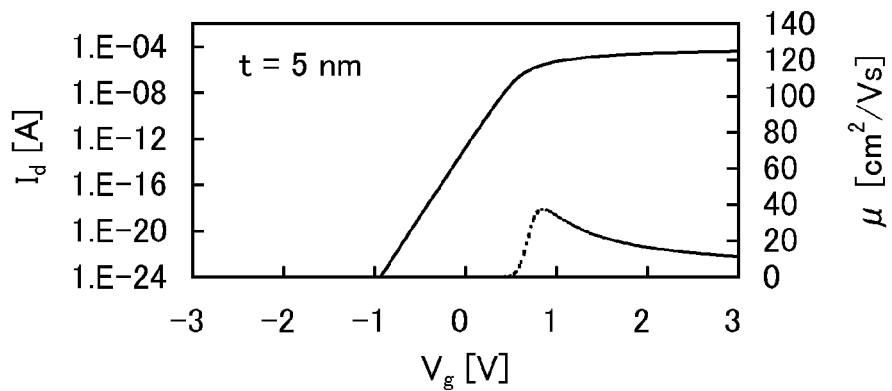
Figure 23A:
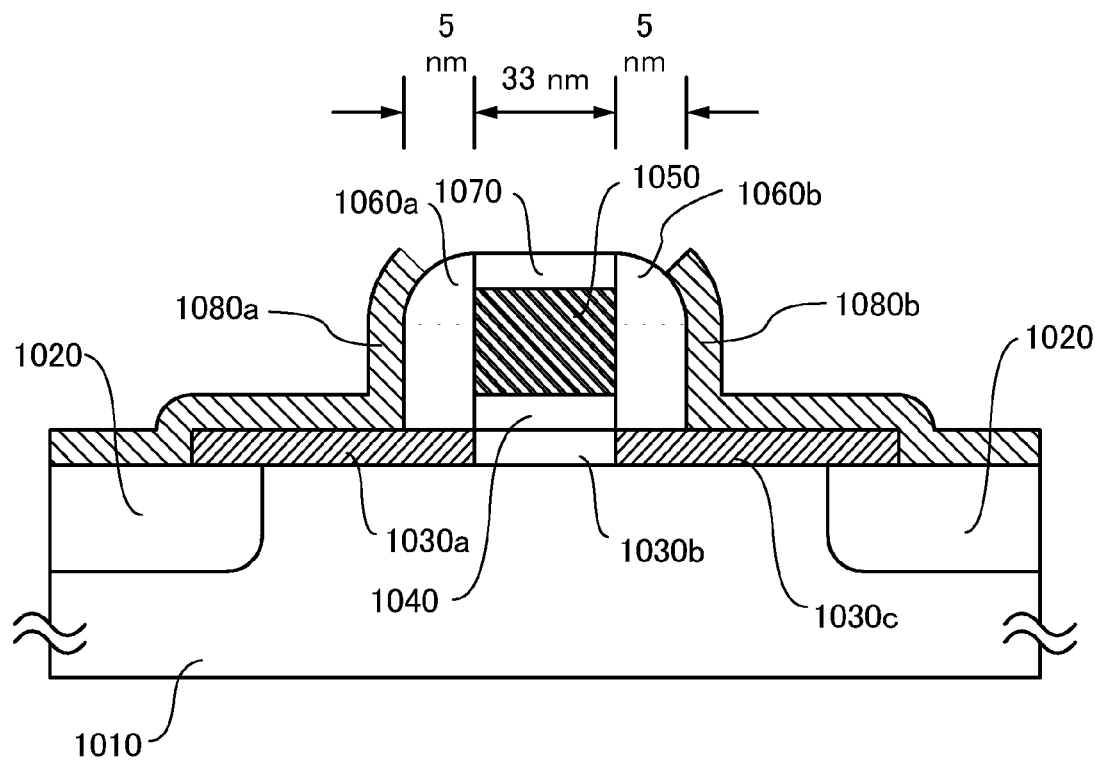
FIGS. 23A and 23B show cross-sectional structures of transistors which are used in calculation.
Figure 23B:
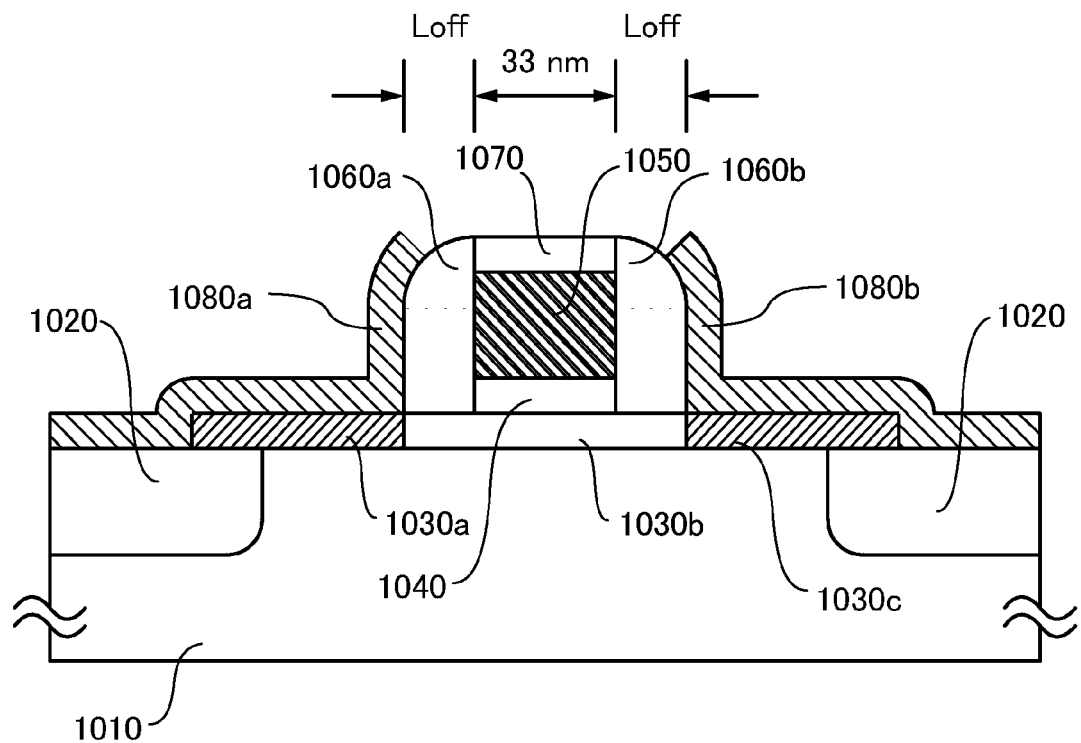

Further, FIGS. 22A to 22C show the gate voltage dependence of the drain current $I_d$ (a solid line) and the mobility $\mu$ (a dotted line) of the transistor having the structure illustrated in FIG. 23B where the offset length $L_{off}$ is 15 nm. The drain current $I_d$ is obtained by calculation under the assumption that the drain voltage is +1 V and the mobility $\mu$ is obtained by calculation under the assumption that the drain voltage is +0.1 V. FIG. 22A shows the gate voltage dependence of the transistor in the case where the thickness of the gate insulating layer is 15 nm, FIG. 22B shows that of the transistor in the case where the thickness of the gate insulating layer is 10 nm, and FIG. 22C shows that of the transistor in the case where the thickness of the gate insulating layer is 5 nm.

In either of the structures, as the gate insulating layer is thinner, the off-state current is significantly decreased, whereas no noticeable change arises in the peak value of the mobility $\mu$ and the on-state current.

Note that the peak of the mobility $\mu$ is approximately 80 cm$^2$/Vs in FIGS. 20A to 20C, approximately 60 cm$^2$/Vs in FIGS. 21A to 21C, and approximately 40 cm$^2$/Vs in FIGS. 22A to 22C; thus, the peak of the mobility $\mu$ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 $\mu$A, which is required in a memory element and the like, at a gate voltage of around 1 V.

A transistor in which an oxide semiconductor including In, Sn, and Zn as main components is used as a channel formation region can have favorable characteristics by depositing the oxide semiconductor while heating a substrate or by performing heat treatment after an oxide semiconductor film is formed. Note that a main component refers to an element included in a composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 24A:
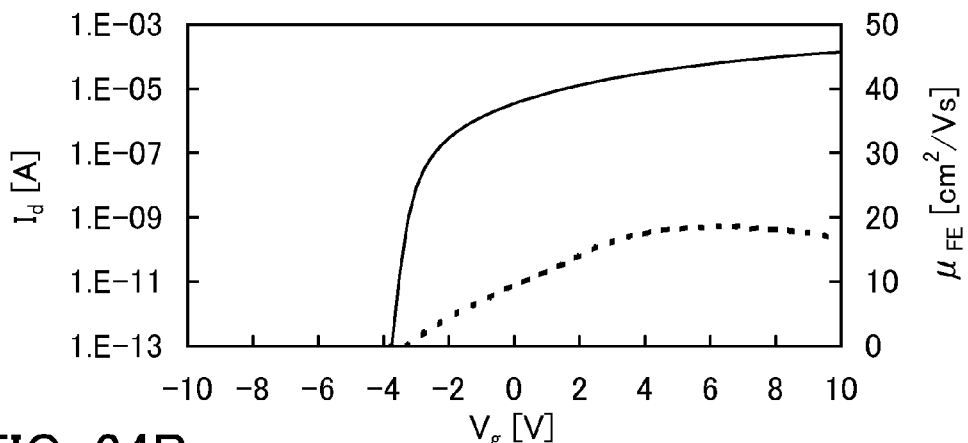
FIGS. 24A to 24C are graphs showing characteristics of transistors according to one embodiment of the present invention.
Figure 24B:
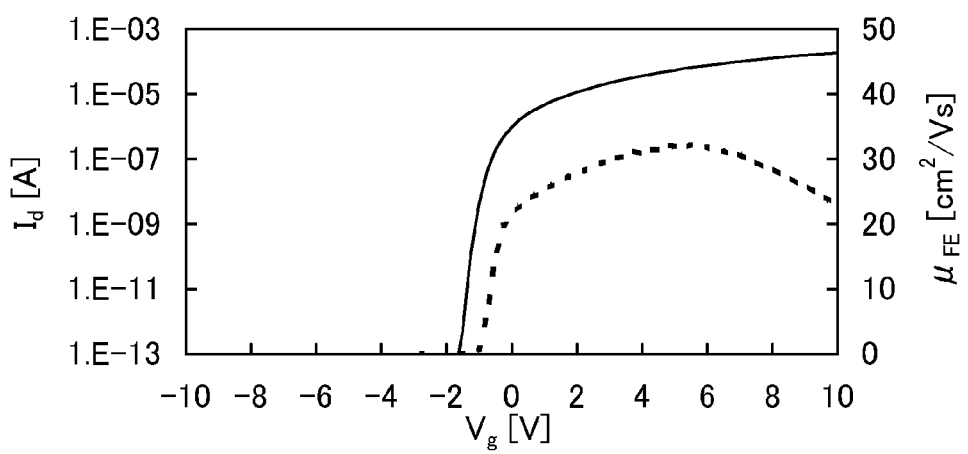
Figure 24C:
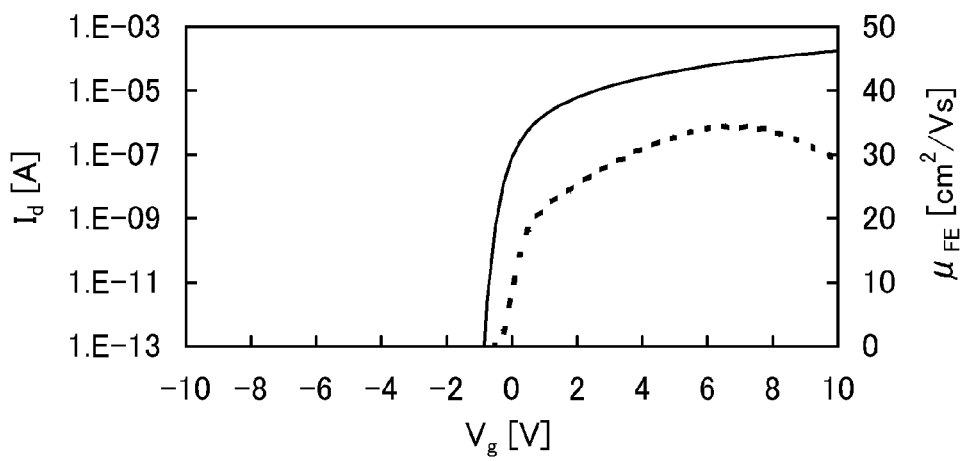

As an example, FIGS. 24A to 24C each show characteristics of a transistor in which an oxide semiconductor film including In, Sn, and Zn as main components and having a channel length L of 3 $\mu$m and a channel width W of 10 $\mu$m, and a gate insulating layer with a thickness of 100 nm are used. Note that $V_d$ was set to 10 V. In FIGS. 24A to 24C, the horizontal axis represents the gate voltage $V_g$, the first vertical axis represents the drain current $I_d$, and the second vertical axis represents the field-effect mobility $\mu_{FE}$.

FIG. 24A shows characteristics of a transistor whose oxide semiconductor film including In, Sn, and Zn as main components was formed by a sputtering method without heating a substrate intentionally. The field-effect mobility of the transistor is 18.8 cm$^2$/Vsec. On the other hand, when the oxide semiconductor film including In, Sn, and Zn as main components is formed while heating the substrate intentionally, the field-effect mobility can be improved. FIG. 24B shows characteristics of a transistor whose oxide semiconductor film including In, Sn, and Zn as main components was formed while heating a substrate at 200° C. The field-effect mobility of the transistor is 32.2 cm$^2$/Vsec.

The field-effect mobility can be further improved by performing heat treatment after formation of the oxide semiconductor film including In, Sn, and Zn as main components. FIG. 24C shows characteristics of a transistor whose oxide semiconductor film including In, Sn, and Zn as main components was formed by sputtering at 200° C. and then subjected to heat treatment at 650° C. The field-effect mobility of the transistor is 34.5 cm$^2$/Vsec.

The intentional heating of the substrate is expected to have an effect of reducing moisture taken into the oxide semiconductor film during the formation by sputtering. Further, the heat treatment after film formation enables hydrogen, a hydroxyl group, or moisture to be released and removed from the oxide semiconductor layer. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being purified by removal of impurities from the oxide semiconductor. In the case of using such a purified non-single crystal oxide semiconductor, ideally, a field-effect mobility exceeding 100 cm$^2$/Vsec is expected to be realized.

The oxide semiconductor including In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. By such crystallization treatment or recrystallization treatment, a non-single crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that includes In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 24A and 24B.

Note that the threshold voltage can also be controlled by changing the ratio of In, Sn, and Zn; when the composition ratio of In, Sn, and Zn is 2:1:3, a normally-off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor layer, and Sample 2 on which heat treatment at 650° C. was performed after formation of an oxide semiconductor layer.

First, $V_g$-$I_d$ characteristics of the transistors were measured at a substrate temperature of 25° C. and $V_d$ of 10 V. Note that $V_d$ refers to a drain voltage (a potential difference between a drain and a source). Then, the substrate temperature was set to 150° C. and $V_d$ was set to 0.1 V. After that, 20 V of $V_g$ was applied so that the intensity of an electric field applied to gate insulating layers was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set at 150° C. and $V_d$ was set to 0.1 V. After that, -20 V of $V_g$ was applied so that the intensity of an electric field applied to the gate insulating layers was -2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 25A:
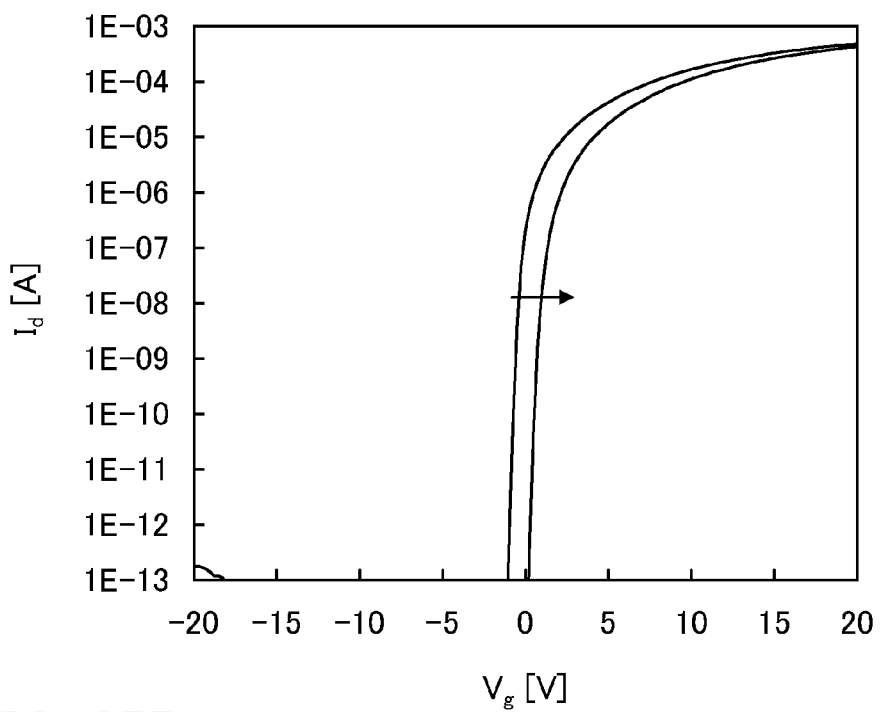
FIGS. 25A and 25B are graphs showing characteristics of transistors according to one embodiment of the present invention.
Figure 25B:
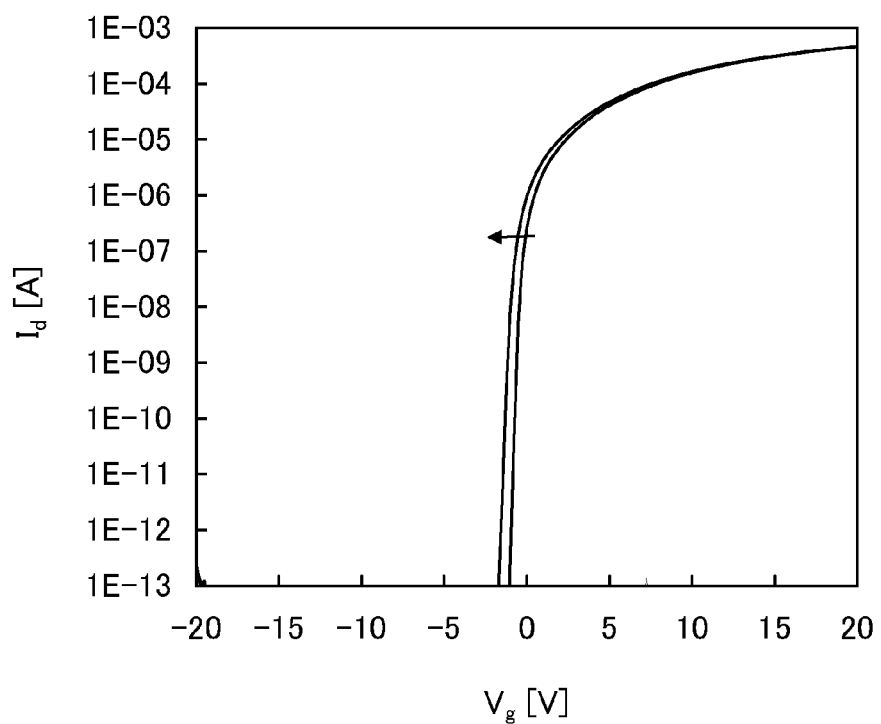
Figure 26A:
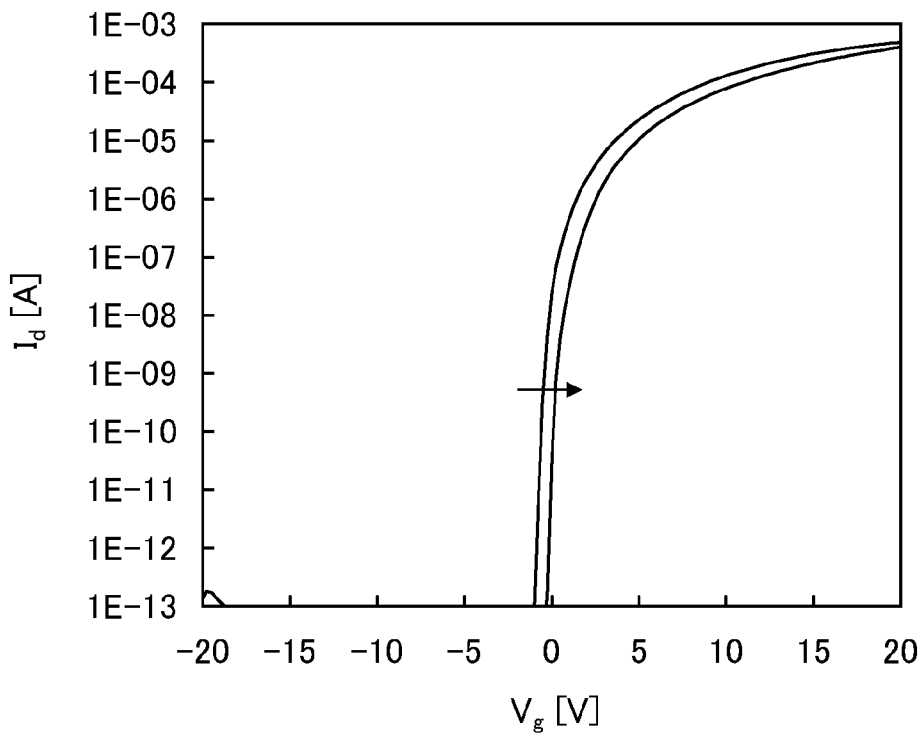
FIGS. 26A and 26B are graphs showing characteristics of transistors according to one embodiment of the present invention.
Figure 26B:
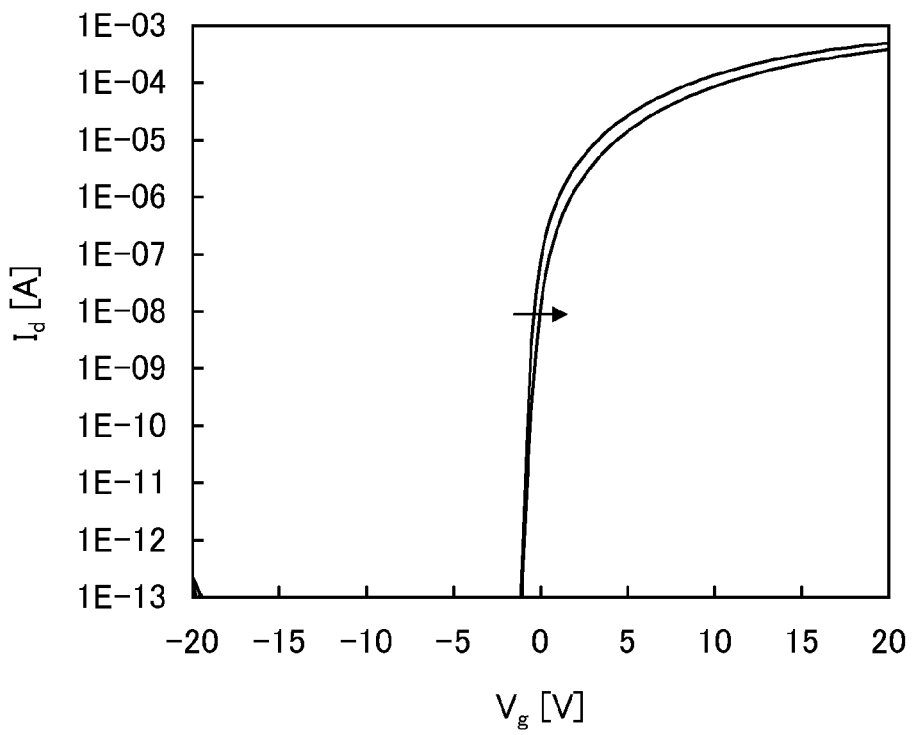

FIGS. 25A and 25B show a result of the positive BT test of Sample 1 and a result of the negative BT test of Sample 1, respectively. FIGS. 26A and 26B show a result of the positive BT test of Sample 2 and a result of the negative BT test of Sample 2, respectively.

The amount of shift in the threshold voltage of Sample 1 due to the positive BT test and that due to the negative BT test were 1.80 V and -0.42 V, respectively. The amount of shift in the threshold voltage of Sample 2 due to the positive BT test and that due to the negative BT test were 0.79 V and 0.76 V, respectively. It is found that, in each of Sample 1 and Sample 2, the amount of shift in the threshold voltage between before and after the BT tests is small and the reliability is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film stacked over the oxide semiconductor; however, when excess oxygen is included in the oxide semiconductor by the heat treatment, oxygen deficiency caused constantly can be compensated for with excess oxygen. The excess oxygen is oxygen existing mainly between lattices. When the concentration of excess oxygen is set to higher than or equal to $1\times10^{16}$/cm$^3$ and lower than or equal to $2\times10^{20}$/cm$^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn—O film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In:Sn:Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 27:
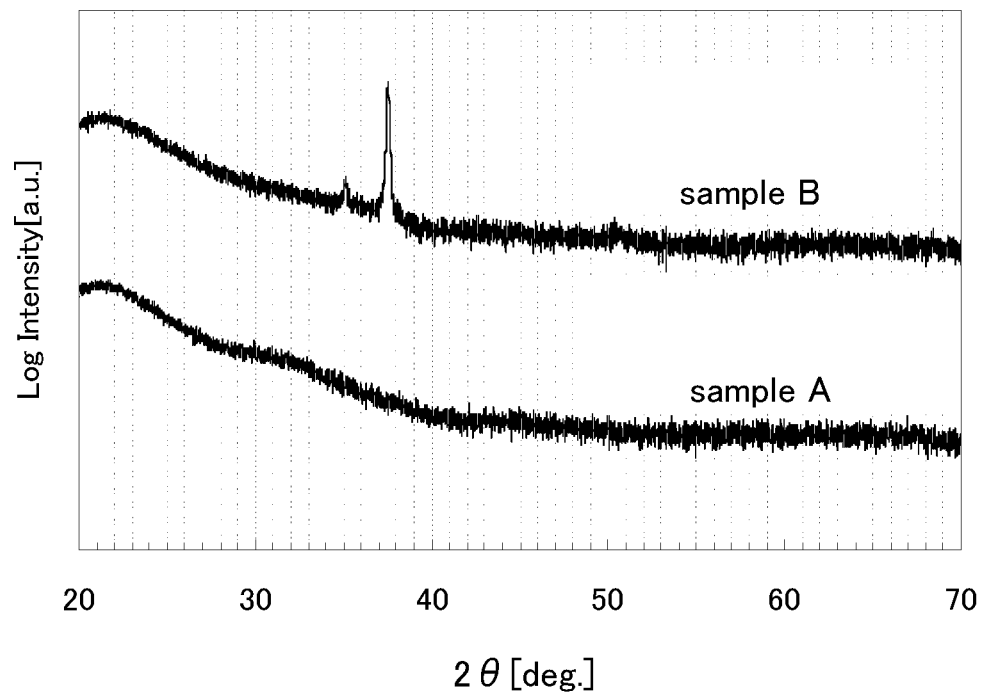
FIG. 27 is a graph showing XRD spectra of a transistor according to one embodiment of the present invention.

FIG. 27 shows XRD spectra of Sample A and Sample B. No peak derived from crystal was observed in Sample A, whereas peaks derived from crystal were observed when 2θ was around 35 deg. and 37 deg. to 38 deg. in Sample B.

As described above, by intentionally heating a substrate during deposition of an oxide semiconductor including In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be purified by removing hydrogen serving as a donor impurity from the oxide semiconductor, whereby a normally-off transistor can be obtained. The purification of an oxide semiconductor enables the off-state current of the transistor to be 1 aA/μm or lower. Here, the unit of the off-state current is used to indicate current per micrometer of a channel width.

Figure 28:
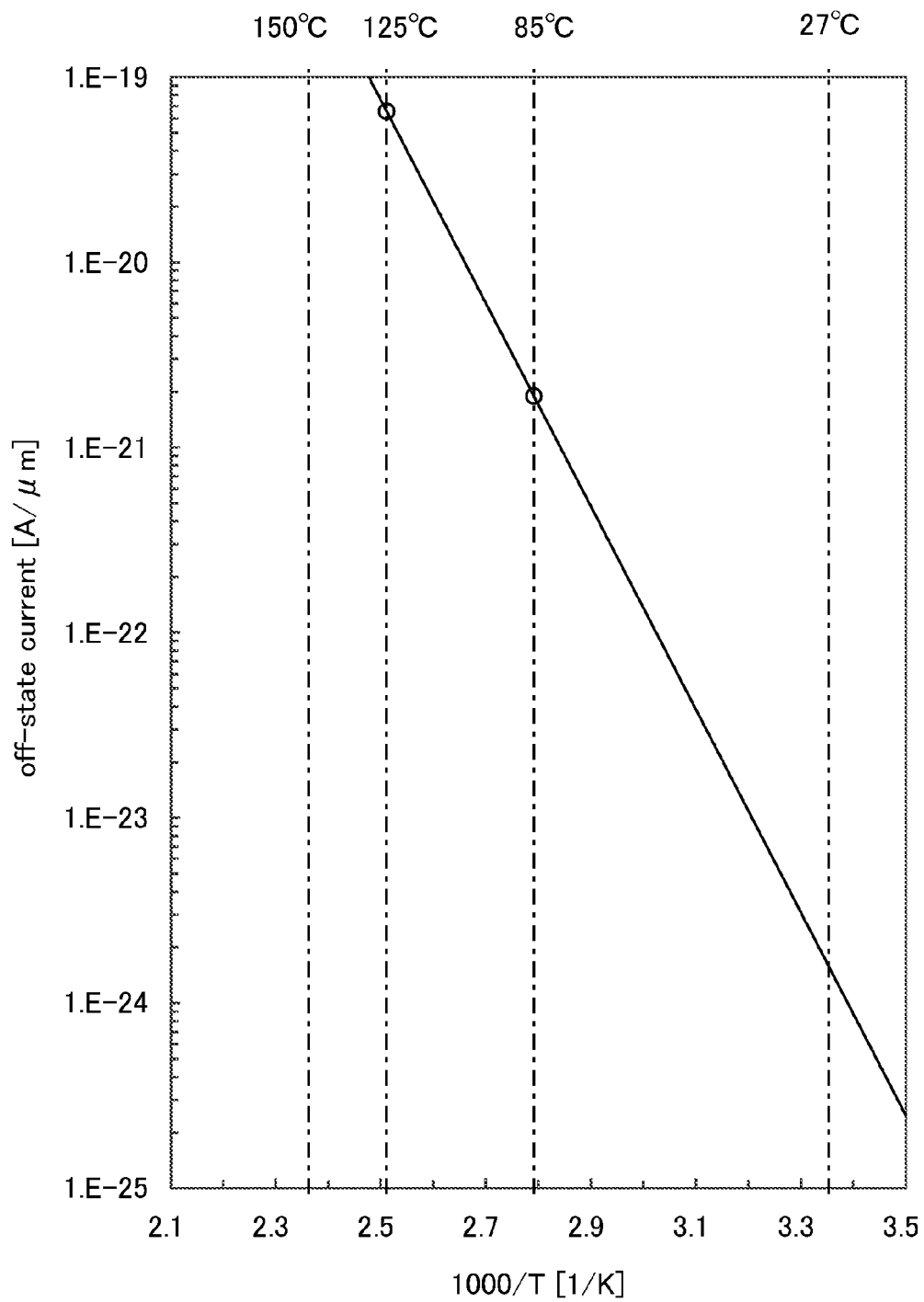
FIG. 28 is a graph showing characteristics of a transistor according to one embodiment of the present invention.

Specifically, FIG. 28 is shown. FIG. 28 is a graph showing a relation between the off-state current per channel width of 1 μm of a transistor and the inverse of substrate temperature T (absolute temperature) at measurement. Here, for simplicity, the horizontal axis represents a value (1000/T) obtained by multiplying an inverse of substrate temperature at measurement by 1000. As shown in FIG. 28, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor formed using Sample B, on which heat treatment at 650° C. was performed after formation of the oxide semiconductor layer was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a pair of electrodes is referred to as Lov, and the width of a portion of the pair of electrodes, which does not overlap with an oxide semiconductor layer, is referred to as dW.

Figure 29:
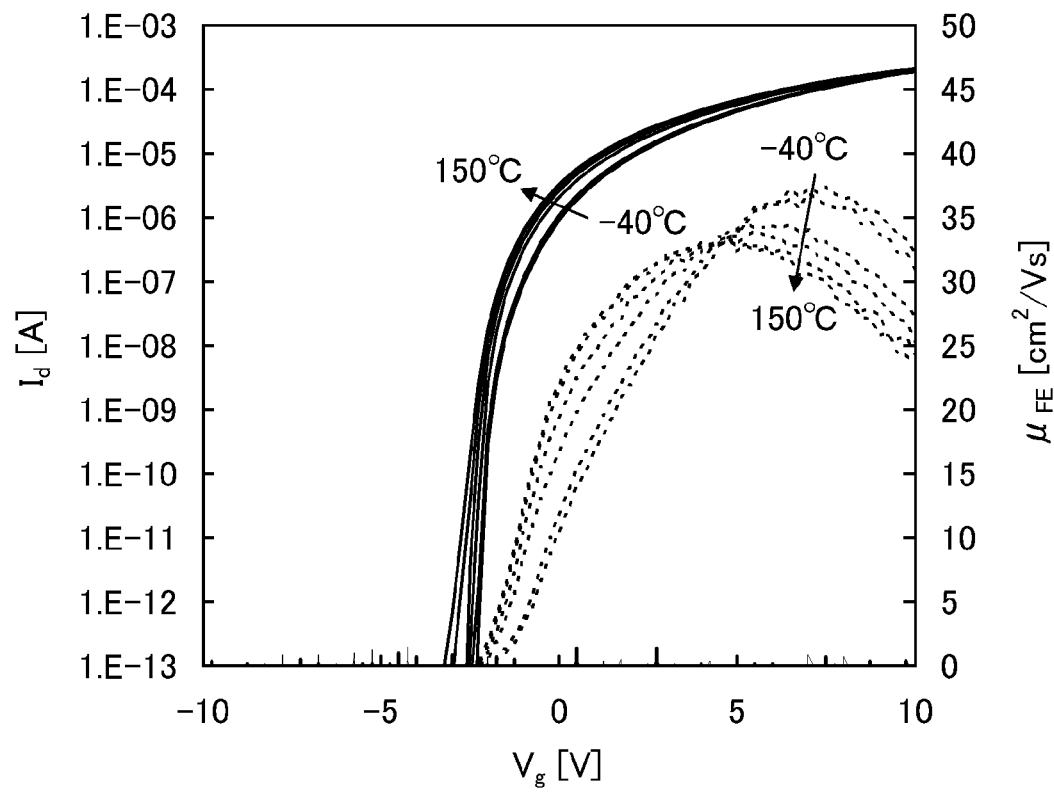
FIG. 29 is a graph showing characteristics of a transistor according to one embodiment of the present invention.
Figure 30A:
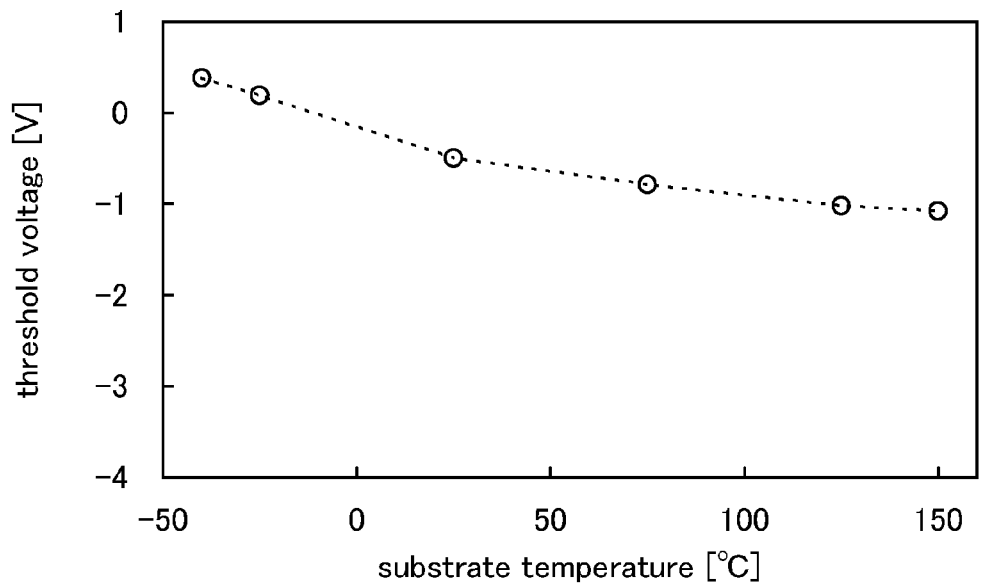
FIGS. 30A and 30B are graphs showing characteristics of transistors according to one embodiment of the present invention.

FIG. 29 shows the $V_g$ dependence of $I_d$ (a solid line) and field-effect mobility $\mu_{FE}$ (a dotted line). FIG. 30A shows a relation between the substrate temperature and the threshold voltage, and FIG. 30B shows a relation between the substrate temperature and the field-effect mobility.

From FIG. 30A, it is found that the threshold voltage gets lower as the substrate temperature increases. Note that the threshold voltage is decreased from 1.09 V to −0.23 V in the range from −40° C. to 150° C.

Figure 30B:
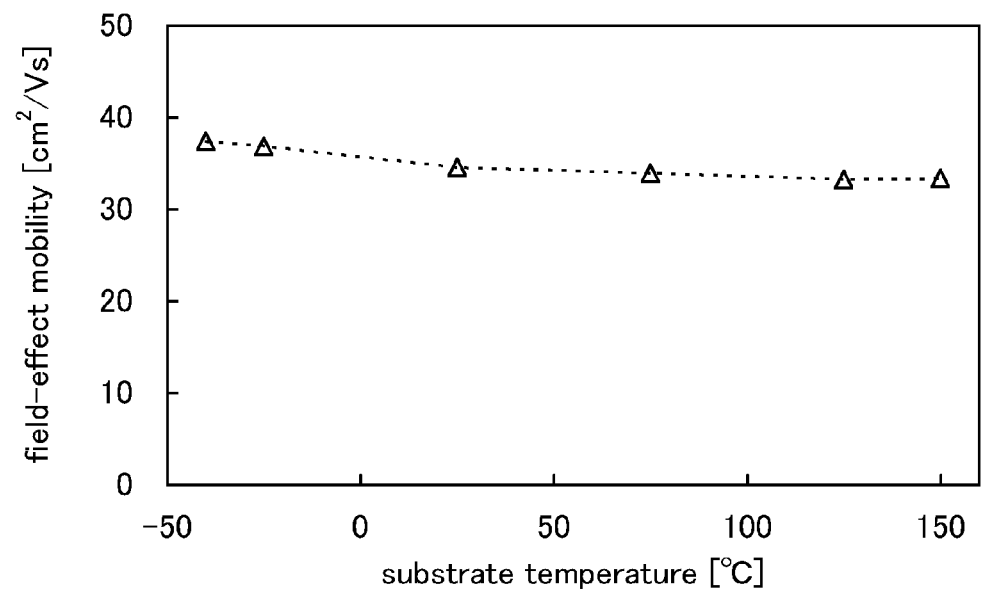

From FIG. 30B, it is found that the field-effect mobility gets lower as the substrate temperature increases. Note that the field-effect mobility is decreased from 36 cm²/Vs to 32 cm²/Vs in the range from −40° C. to 150° C. Thus, it is found that variation in electric characteristics is small in the above temperature range.

In a transistor in which such an oxide semiconductor including In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in combination with any of the structures of embodiments or examples in this specification as appropriate.

Embodiment 5

A display device 100 can be applied to a display portion of a variety of electronic devices (including game machines). Examples of the electronic devices are a television device (also referred to as a television or a television receiver), a monitor of a computer or the like, a camera such as a digital camera or a digital video camera, a digital photo frame, a mobile phone (also referred to as a mobile telephone or a mobile phone device), a portable game console, a portable information terminal, an audio reproducing device, a commercial game machine such as a pachinko machine, a slot machine, and the like. Electronic devices including a display portion will be described with reference to FIGS. 10A to 10D.

Figure 10A:
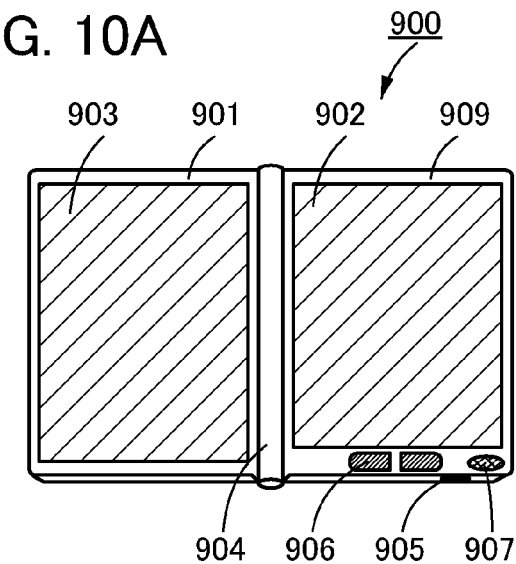
FIGS. 10A to 10D are diagrams each showing an example of a structure of an electronic device including a display portion.

In FIG. 10A, an example of an electronic book reader is shown. An electronic book reader 900 includes two housings; a housing 909 and a housing 901. The housing 909 and the housing 901 are combined with each other by a hinge 904 so that the electronic book reader can be opened and closed. With such a structure, the electronic book reader can be opened and closed like a paper book.

A display portion 902 is incorporated in the housing 909, and a display portion 903 is incorporated in the housing 901. The housing 909 is provided with a power input terminal 905, an operation key 906, a speaker 907, and the like. The electronic book reader 900 can switch two modes: a display mode in which one image is displayed on the display portion 902 and the display portion 903, and a display mode in which different images are displayed on the display portion 902 and the display portion 903.

Figure 10B:
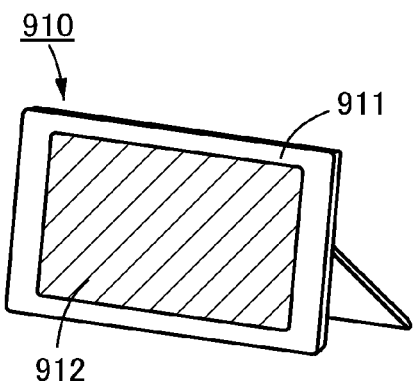

In FIG. 10B, an example of a digital photo frame is shown. In a digital photo frame 910, a display portion 912 is incorporated in a housing 911. In the display portion 912, a still image and a moving image are displayed.

Figure 10C:
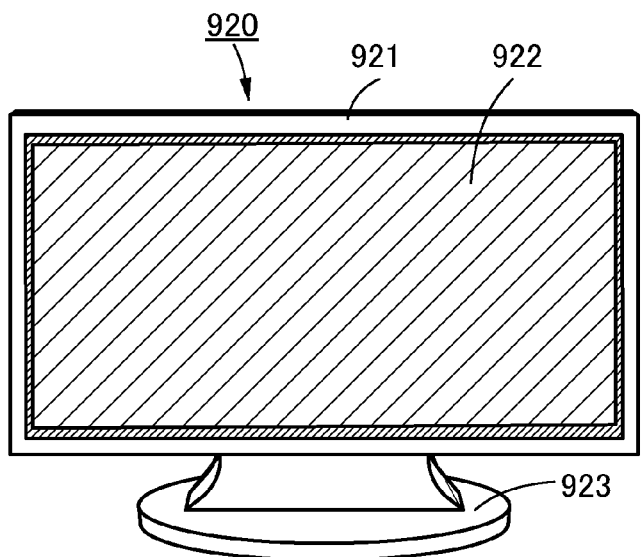

In FIG. 10C, an example of a television device using the display device 100 is shown. In a television device 920, a display portion 922 is incorporated in a housing 921, and a housing 921 is supported by a stand 923.

Figure 10D:
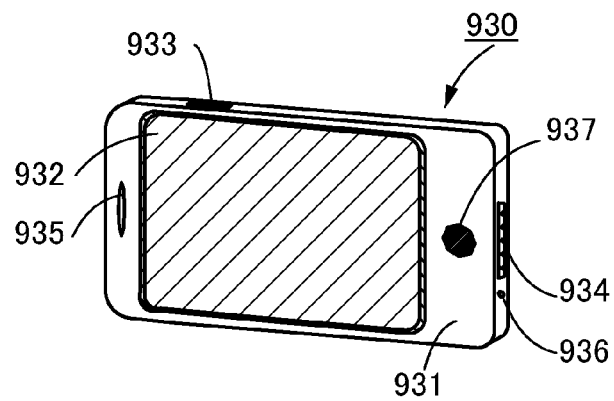
Figure 11:
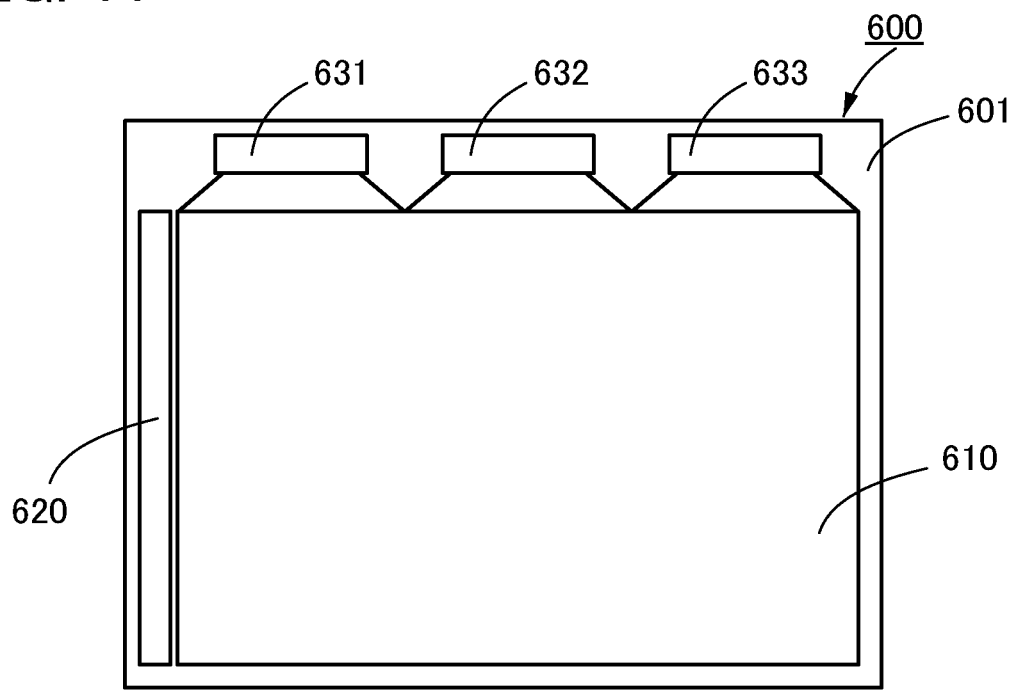
FIG. 11 is a block diagram showing an example of a conventional display device including a source driver IC chip.
Figure 12:
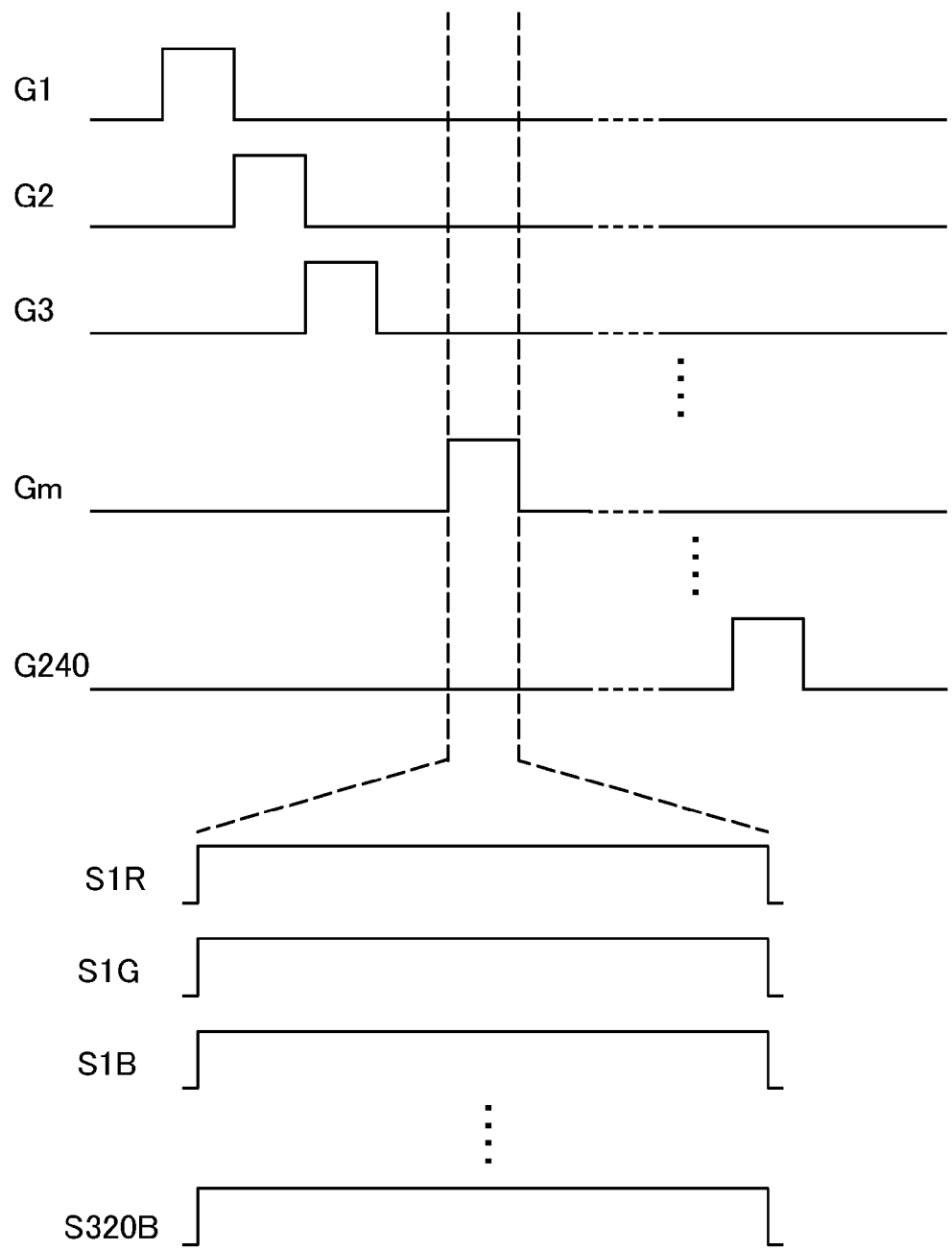
FIG. 12 is a flow chart showing an example of a driving method of the display device in FIG. 11.
Figure 13:
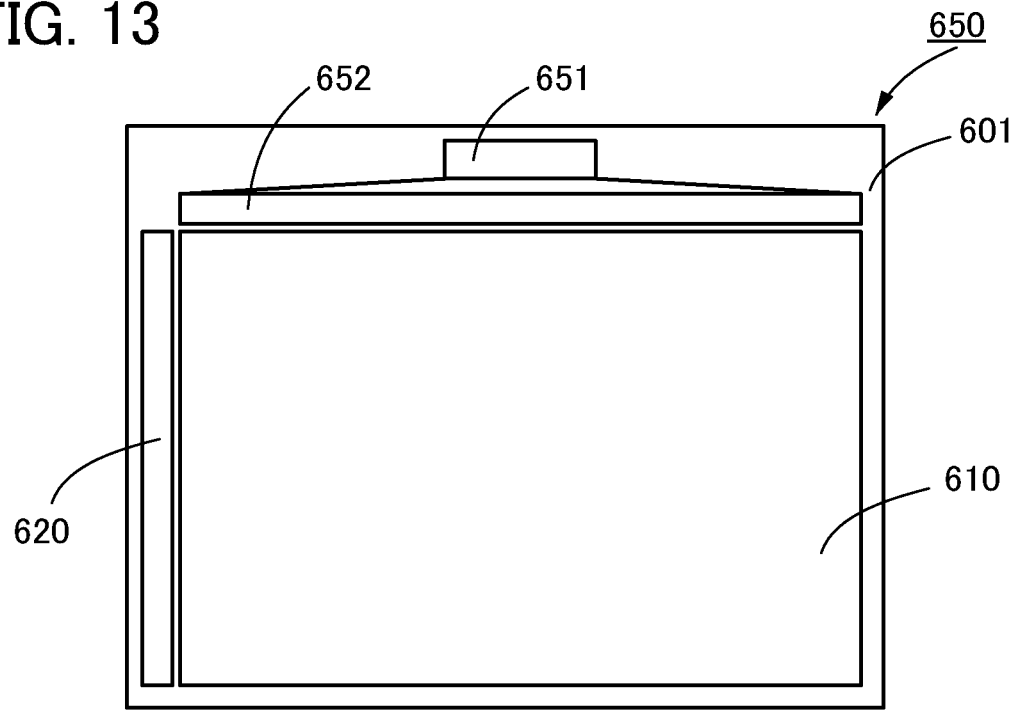
FIG. 13 is a block diagram showing an example of a conventional display device including a source driver IC chip.
Figure 14:
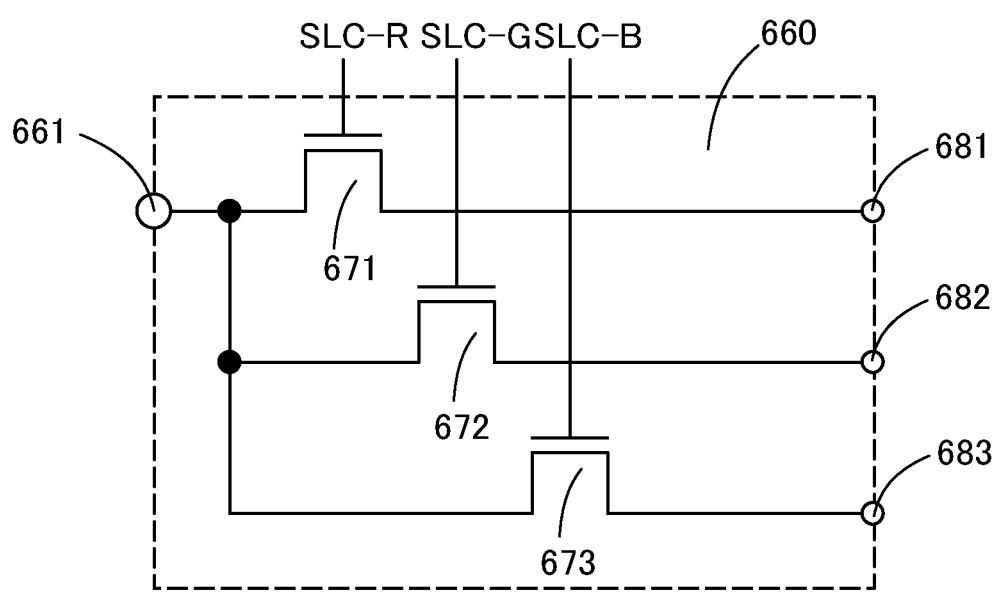
FIG. 14 is a circuit diagram showing an example of a structure of the analog switch array of the source driver circuit in FIG. 13.

In FIG. 10D, an example of a portable information terminal using the display device 100 is shown. A portable information terminal 930 is provided with a display portion 932 incorporated in a housing 931, operation buttons 933 and 937, an external connection port 934, a speaker 935, a microphone 936, and the like. The display portion 932 is a touch panel. When the display portion 932 is touched with a finger or the like, contents displayed on the display portion 932 can be controlled. Further, the portable information terminal 930 functions as a mobile phone. Operations such as making a phone call and texting can be performed by touching the display portion 932 with a finger or the like.

Note that this embodiment can be implemented in combination with any of other embodiments or examples as appropriate.

Example 1

In this example, an example of a transistor in which an In—Sn—Zn—O film is used as an oxide semiconductor film will be described with reference to FIGS. 31A and 31B.

Figure 31A:
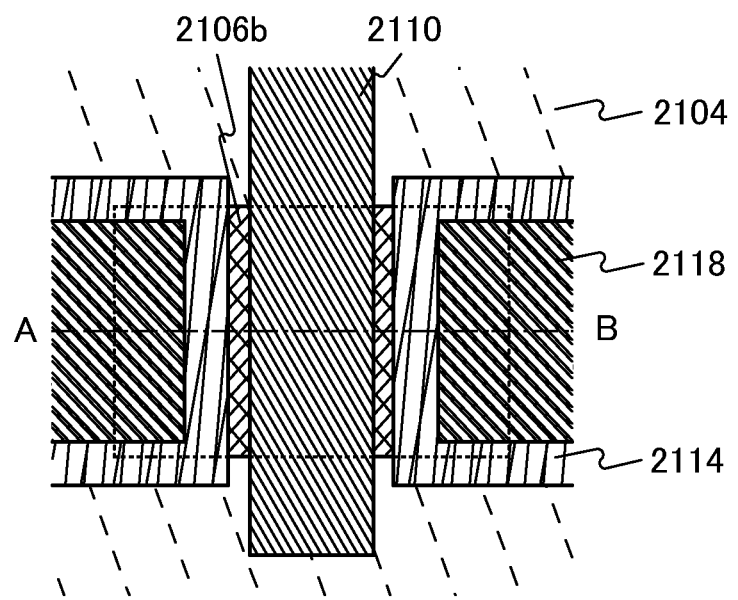
FIGS. 31A and 31B are diagrams showing a structure of a transistor according to an embodiment of the present invention.
Figure 31B:
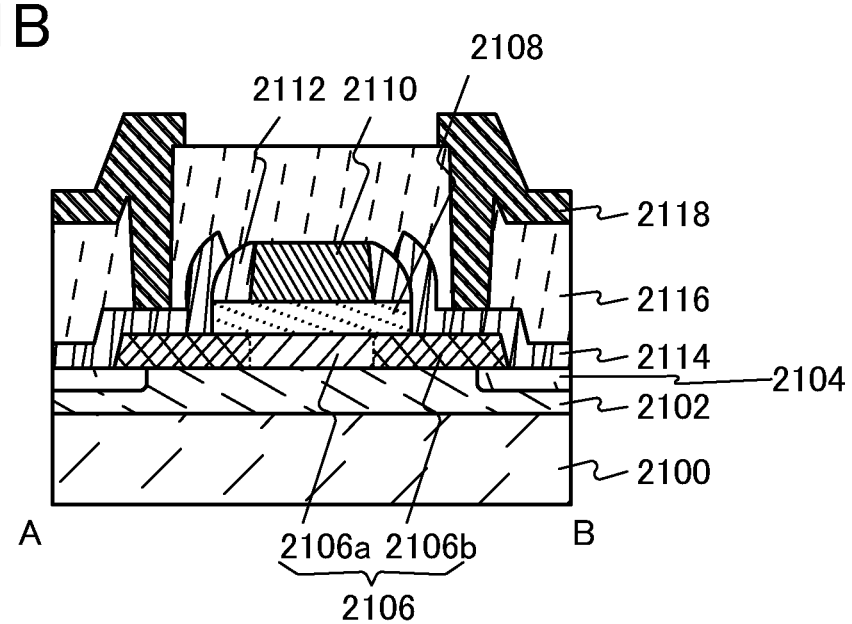

FIGS. 31A and 31B are a top view and a cross-sectional view of a coplanar transistor having a top-gate top-contact structure. FIG. 31A is the top view of the transistor. FIG. 31B illustrates cross section A-B along dashed-dotted line A-B in FIG. 31A.

The transistor illustrated in FIG. 31B includes a substrate 2100; a base insulating layer 2102 provided over the substrate 2100; a protective insulating film 2104 provided in the periphery of the base insulating layer 2102; an oxide semiconductor film 2106 provided over the base insulating layer 2102 and the protective insulating film 2104 and including a high-resistance region 2106a and low-resistance regions 2106b; a gate insulating layer 2108 provided over the oxide semiconductor film 2106; a gate electrode 2110 provided to overlap with the oxide semiconductor film 2106 with the gate insulating layer 2108 positioned therebetween; a sidewall insulating film 2112 provided in contact with a side surface of the gate electrode 2110; a pair of electrodes 2114 provided in contact with at least the low-resistance regions 2106b; an interlayer insulating film 2116 provided to cover at least the oxide semiconductor film 2106, the gate electrode 2110, and the pair of electrodes 2114; and a wiring 2118 provided to be connected to at least one of the pair of electrodes 2114 through an opening formed in the interlayer insulating film 2116.

Although not illustrated, a protective film may be provided to cover the interlayer insulating film 2116 and the wiring 2118. With the protective film, a minute amount of leakage current generated by surface conduction of the interlayer insulating film 2116 can be reduced and thus the off-state current of the transistor can be reduced.

Example 2

In this example, another example of a transistor in which an In—Sn—Zn—O film is used as an oxide semiconductor film will be described.

Figure 32A:
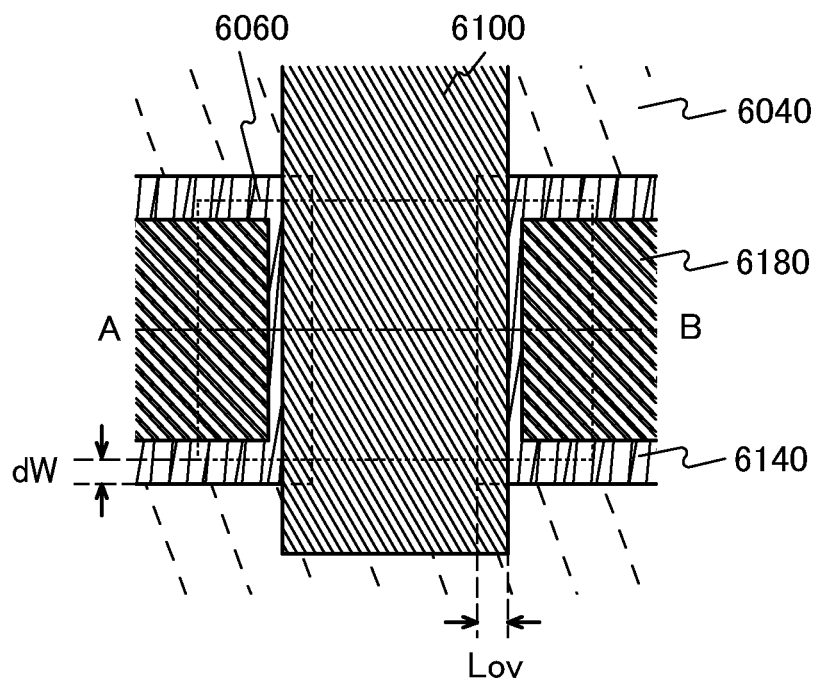
FIGS. 32A and 32B are diagrams showing a structure of a transistor according to an embodiment of the present invention.
Figure 32B:
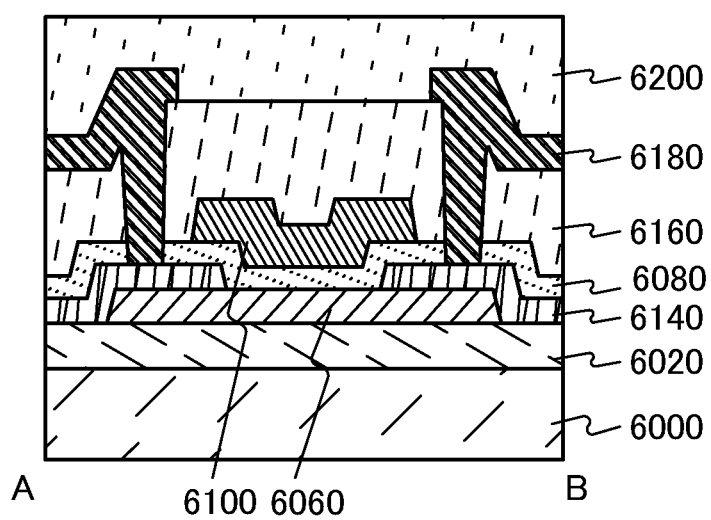

FIGS. 32A and 32B are a top view and a cross-sectional view which illustrate a structure of a transistor. FIG. 32A is the top view of the transistor. FIG. 32B is a cross-sectional view along dashed-dotted line A-B in FIG. 32A.

The transistor illustrated in FIG. 32B includes a substrate 6000; a base insulating layer 6020 provided over the substrate 6000; an oxide semiconductor film 6060 provided over the base insulating layer 6020; a pair of electrodes 6140 in contact with the oxide semiconductor film 6060; a gate insulating layer 6080 provided over the oxide semiconductor film 6060 and the pair of electrodes 6140; a gate electrode 6100 provided to overlap with the oxide semiconductor film 6060 with the gate insulating layer 6080 provided therebetween; an interlayer insulating film 6160 provided to cover the gate insulating layer 6080 and the gate electrode 6100; wirings 6180 connected to the pair of electrodes 6140 through openings formed in the interlayer insulating film 6160; and a protective film 6200 provided to cover the interlayer insulating film 6160 and the wirings 6180.

As the substrate 6000, a glass substrate can be used. As the base insulating layer 6020, a silicon oxide film can be used. As the oxide semiconductor film 6060, an In—Sn—Zn—O film can be used. As the pair of electrodes 6140, a tungsten film can be used. As the gate insulating layer 6080, a silicon oxide film can be used. The gate electrode 6100 can have a stacked structure of a tantalum nitride film and a tungsten film. The interlayer insulating film 6160 can have a stacked structure of a silicon oxynitride film and a polyimide film. The wirings 6180 can each have a stacked structure in which a titanium film, an aluminum film, and a titanium film are formed in this order. As the protective film 6200, a polyimide film can be used.

Note that in the transistor having the structure illustrated in FIG. 32A, the width of a portion where the gate electrode 6100 overlaps with one of the pair of electrodes 6140 is referred to as Lov. Similarly, the width of a portion of the pair of electrodes 6140, which does not overlap with the oxide semiconductor film 6060, is referred to as dW.

This application is based on Japanese Patent Application serial no. 2010-206206 filed with the Japan Patent Office on Sep. 15, 2010 and Japanese Patent Application serial no. 2011-108150 filed with the Japan Patent Office on May 13, 2011, the entire contents of which are hereby incorporated by reference.

What is claimed is:

1. A display device comprising:
    a first functional circuit comprising:
        a first input terminal inputted with a signal including n image data (n is an integer greater than or equal to 3); and
        n first transistors electrically connected to the first input terminal in parallel;
    a second functional circuit comprising:
        n first memory elements;
        n second transistors; and
        n second memory elements; and
    a third functional circuit,
    wherein the first functional circuit divides the signal inputted to the first input terminal into n image data,
    wherein each of the n first memory elements is electrically connected to a corresponding one of the n first transistors,
    wherein the n first memory elements are inputted with the n image data,
    wherein each of the n second transistors is electrically connected to a corresponding one of the n first memory elements, wherein the n second transistors transfer the n image data held in the n first memory elements to the n second memory elements at the same timing, wherein the third functional circuit outputs the n image data held in the n second memory elements to n source lines, wherein channel formation regions of the n second transistors comprise oxide semiconductor layers including indium, wherein a wiring is connected to gates of the n second transistors, and wherein on/off of the n second transistors are controlled by a signal input to the wiring.

2. The display device according to claim 1, further comprising a fourth functional circuit outputting the signal including the n image data to the first input terminal of the first functional circuit, wherein the fourth functional circuit comprises an IC chip.

3. The display device according to claim 1, further comprising:
- a fourth functional circuit comprising:
  - a second input terminal inputted with a signal including m image data (m is
- an integer greater than or equal to 3);
- a fifth functional circuit comprising:
  - m third memory elements;
  - m fourth memory elements; and
- a sixth functional circuit,
- wherein the fifth functional circuit comprises third transistors, and
- wherein the wiring is connected to gates of the third transistors.

4. A display device comprising:
- a first functional circuit comprising:
  - an input terminal inputted with a signal including n image data (n is an integer greater than or equal to 3); and
  - n first transistors electrically connected to the input terminal in parallel;
- a second functional circuit comprising:
  - n first memory elements;
  - n second transistors; and
  - n second memory elements;
- a third functional circuit;
- a pixel region; and
- a substrate,
- wherein the first functional circuit divides the signal inputted to the input terminal into n image data,
- wherein each of the n first memory elements is electrically connected to a corresponding one of the n first transistors,
- wherein the n first memory elements are inputted with the n image data,
- wherein each of the n second transistors is electrically connected to a corresponding one of the n first memory elements,
- wherein the n second transistors transfer the n image data held in the n first memory elements to the n second memory elements at the same timing,
- wherein the third functional circuit outputs the n image data held in the n second memory elements to n source lines, and
- wherein the first functional circuit, the second functional circuit, the third functional circuit and the pixel region are formed over the substrate,
- wherein channel formation regions of the n second transistors comprise oxide semiconductor layers including indium,
- wherein a wiring is connected to gates of the n second transistors, and
- wherein on/off of the n second transistors are controlled by a signal input to the wiring.

5. The display device according to claim 4, further comprising a fourth functional circuit outputting the signal including the n image data to the input terminal of the first functional circuit, wherein the fourth functional circuit comprises an IC chip mounted on the substrate.

6. A display device comprising:
- an input terminal;
- n switches (n is an integer greater than or equal to 3) connected to the input terminal in parallel and controlled with respective signals;
- n first memory elements;
- n transfer switches controlled with a same signal;
- n second memory elements;
- n buffers; and
- n source lines,
- wherein each of the n first memory elements is directly connected to an output terminal of a corresponding one of the n switches,
- wherein each input terminal of the n transfer switches is connected to a corresponding one of the n first memory elements,
- wherein each of the n second memory elements is connected to an output terminal of a corresponding one of the n transfer switches,
- wherein each input terminal of the n buffers is connected to a corresponding one of the n second memory elements,
- wherein each of the n source lines is connected to an output terminal of a corresponding one of the n buffers,
- wherein the n transfer switches comprise transistors, and channel formation regions of the transistors comprise oxide semiconductors,
- wherein a wiring is connected to gates of the transistors, and
- wherein on/off of the transistors are controlled by a signal input to the wiring.

7. The display device according to claim 6, wherein the n switches, the n first memory elements, the n second memory elements, the n transfer switches, and the n buffers are formed over a substrate in which the n source lines are formed.

8. A display device comprising:
- n source lines (n is an integer greater than or equal to 3);
- n second memory elements;
- n transfer switches controlled with a same signal;
- n first memory elements;
- n switches controlled with respective signals; and
- an input terminal in which the n switches are connected in parallel,
- wherein each of the n second memory elements is connected to a corresponding one of n source lines,
- wherein each output terminal of the n transfer switches is connected to a corresponding one of the n second memory elements,
- wherein each of the n first memory elements is connected to an input terminal of a corresponding one of the n transfer switches,
- wherein each output terminal of the n switches is directly connected to a corresponding one of the n first memory elements,
- wherein the n switches comprise first transistors and the n transfer switches comprise second transistors, and channel formation regions of the first and the second transistors comprise oxide semiconductors, wherein a wiring is connected to gates of the second transistors, and wherein on/off of the second transistors are controlled by a signal input to the wiring.

9. The display device according to claim 8, wherein the n switches, the n first memory elements, the n second memory elements and the n transfer switches are formed over a substrate in which the n source lines are formed.

* * * * *